United States Patent
Luong et al.

Patent Number: 5,790,568
Date of Patent: Aug. 4, 1998

[54] SPACECRAFT REED-SOLOMON DOWNLINK MODULE

[75] Inventors: Huy H. Luong, Alhambra; James A. Donaldson, Glendale; Steven H. Wood, Los Angeles, all of Calif.

[73] Assignee: California Institute of Technology, Pasadena, Calif.

[21] Appl. No.: 594,728

[22] Filed: Jan. 31, 1996

[51] Int. Cl.⁶ .................................................. G03M 13/00
[52] U.S. Cl. ........................................................ 371/37.1
[58] Field of Search ............................................. 371/37.1

[56] References Cited

U.S. PATENT DOCUMENTS 3,988,677  10/1976  Fletcher et al. .................... 371/37.5
4,410,989  10/1983  Berlekamp ........................ 371/39.1
4,907,233   3/1990  Deutsch et al. ................... 371/37.4

*Primary Examiner*—Stephen M. Baker
*Attorney, Agent, or Firm*—Fish & Richardson P.C.

[57] ABSTRACT

Apparatus and method for providing downlink frames to be transmitted from a spacecraft to a ground station. Each downlink frame includes a synchronization pattern and a transfer frame. The apparatus may comprise a monolithic Reed-Solomon downlink (RSDL) encoding chip coupled to data buffers for storing transfer frames. The RSKL chip includes a timing device, a bus interface, a timing and control unit, a synchronization pattern unit, and a Reed-Solomon encoding unit, and a bus arbiter.

20 Claims, 16 Drawing Sheets

FUNCTIONAL BLOCK DIAGRAM OF THE RSDL CHIP

FUNCTIONAL BLOCK DIAGRAM OF THE RSDL CHIP

LAUNCH VEHICLE INTERFACE TIMING WAVEFORMS

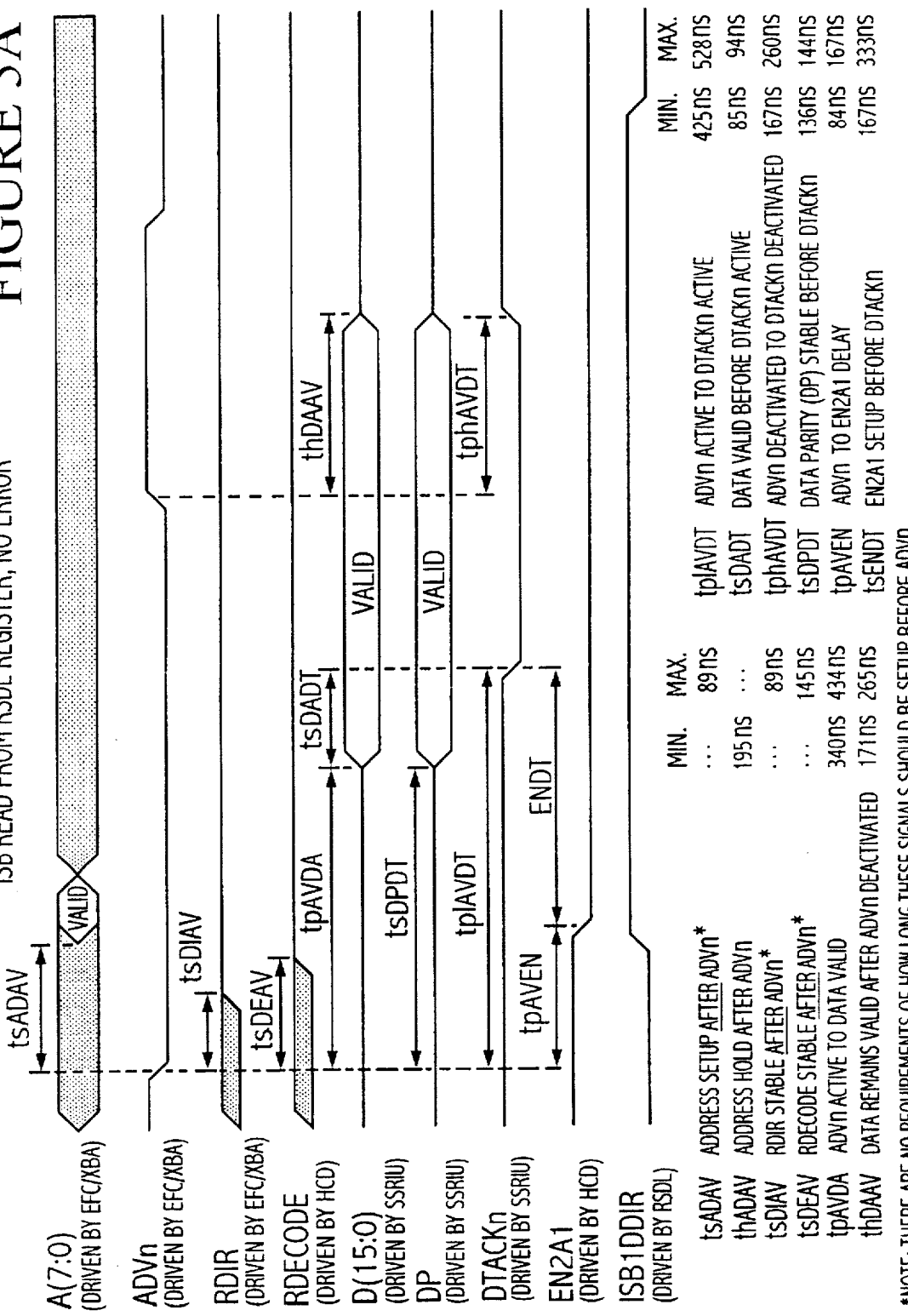

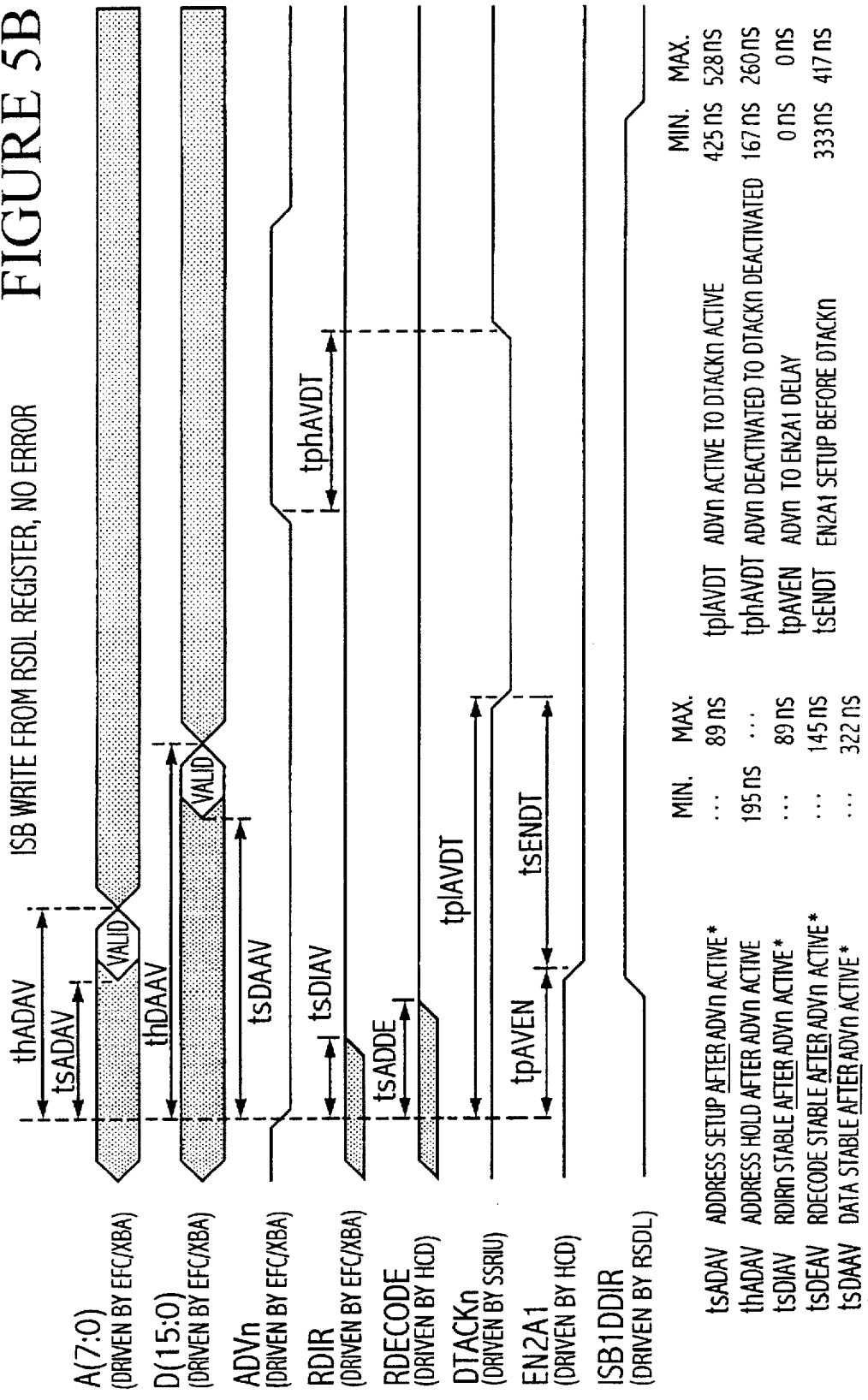

RELATIONSHIP BETWEEN POR/SWRSTn & FST-CAP

RELATIONSHIP BETWEEN RTIn & FST-CAP

Note: This counter divides 27 for 511 pulses but divides 28 for the 512ns pulse

Time Chain Section

DOWNLINK DATA RATE GENERATOR

Figure 6.3.3.a Control signals of 2A2 Board Address Bus

SPACECRAFT REED-SOLOMON DOWNLINK MODULE

STATEMENT AS TO FEDERALLY SPONSORED RESEARCH

The invention described herein was made in the performance of work under a NASA contract, and is subject to the provisions of Public Law 96-517 (35 U.S.C. §202), in which the Contractor has elected to retain title.

BACKGROUND OF THE INVENTION

1. Field of the Invention

This invention relates to an assembly for improving speed and accuracy of communications in a spacecraft downlink system. More particularly, this invention relates to a module used for performing Reed-Solomon encoding and timing for downlinking signals from a spacecraft to a ground station. (For convenience, the term "spacecraft" will be used throughout the remainder of this specification and is intended to encompass satellites as well as other spacecraft.)

2. Background and Summary

Size, weight, and power requirements are important when designing a spacecraft. Heavier payloads are more expensive to launch. Package size is also important, because the size of a spacecraft is proportional to its weight.

One of the important functions carried out by a spacecraft or satellite system is called downlink communications. Signals are transmitted from the spacecraft down the "link" to a ground station. These signals include engineering and science data collected by the spacecraft. Communication of these signals is carried out using any well-known format.

Spacecraft communications are inherently noisy. Reed-Solomon error detecting and correcting code is commonly used for improving the communications. Reed-Solomon processing and communication of downlink signals is carried out using a number of multi-chip subassemblies to process, buffer, and transmit the data appropriately. One such multi-chip subassembly is known as a Reed-Solomon downlink ("RSDL") module. Multi-chip RSDL modules have been used for spacecraft timing and for encoding and sending telemetry data to a control unit. The RSDL module reads in data from an interface unit and forms downlink data frames.

Such conventional multi-chip RSDL modules, however, consume a significant amount of power, as they incorporate many discrete components and circuits. Moreover, even while consuming so much power, multi-chip RSDL modules still operate slowly. They are also large and heavy, a significant detriment to spacecraft performance.

Accordingly, the inventors recognized the need for an RSDL module that is light-weight, small, power-efficient, and reliable. The present invention provides such an RSDL module.

It is an object of the present invention to form a system that carries out Reed-Solomon downlink processing and control in an improved way.

One aspect of the invention is a monolithic Reed-Solomon downlink (RSDL) encoding chip for processing downlink frames to be transmitted from a spacecraft to the ground. The RSDL encoding chip is couplable to data buffers that store downlink data and to a data bus. The RSDL encoding chip includes on a single chip a timing unit, a bus interface, a timing control unit, a synchronization pattern unit, a Reed-Solomon encoding unit, and a bus arbiter. The inventors of the present invention recognized that combining these functional blocks in the same device produces some economies because there is a certain coupling between various functions. Further, the inventors were able to substantially decrease the size and weight and increase the reliability of the RSDL module by incorporating these blocks on a single chip.

BRIEF DESCRIPTION OF THE DRAWINGS

These and other aspects of the invention will now be described in detail with reference to the accompanying drawings, wherein:

FIGS. 5A and 5B show the protocol for read and write cycles of a subassembly bus interface with no errors.

DESCRIPTION OF THE PREFERRED EMBODIMENTS

Throughout this description, the preferred embodiment and the examples shown should be considered as exemplars, rather than as limitations on the present invention.

I. SPACECRAFT COMMAND AND DATA SUBSYSTEM

Figure 1:
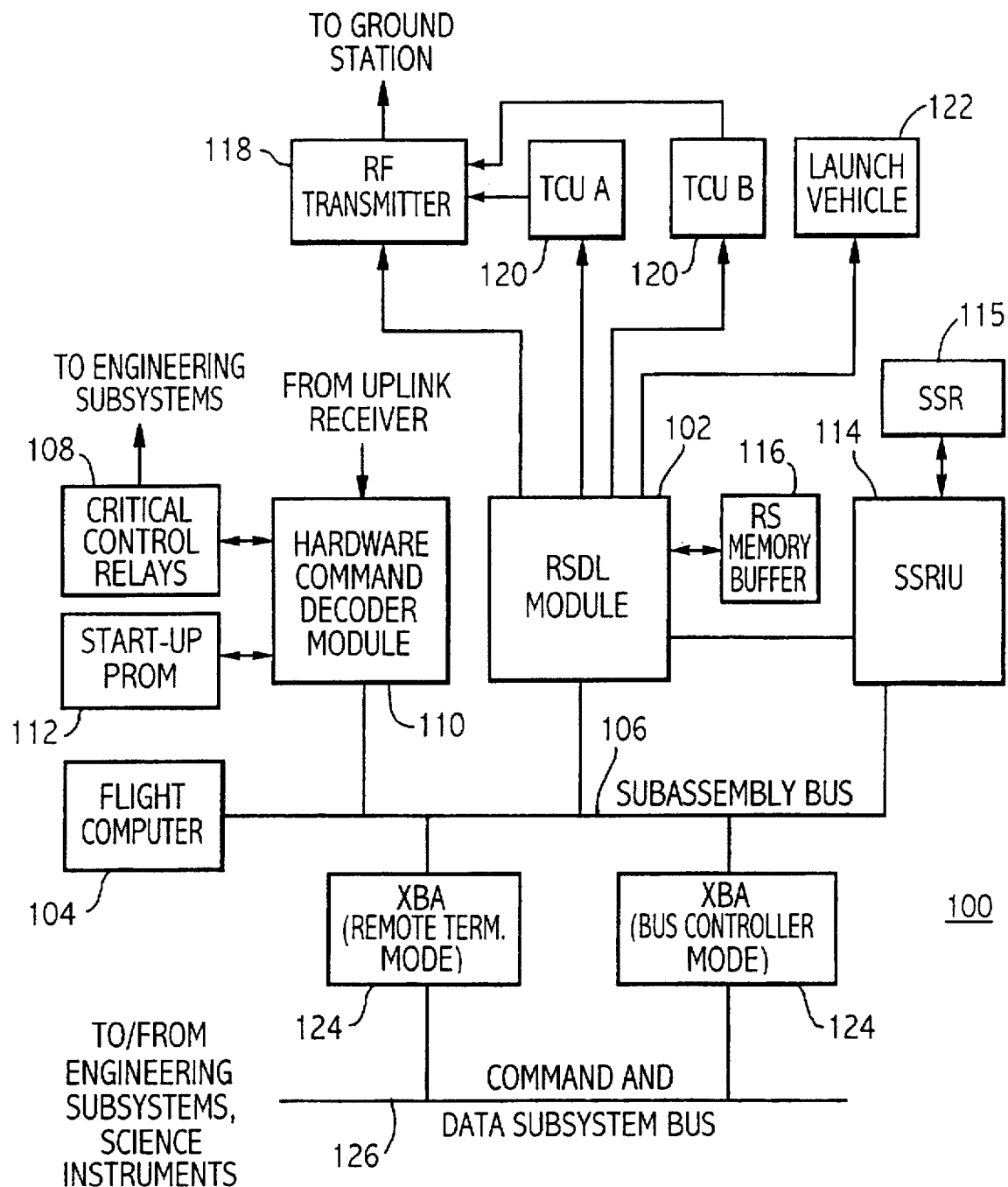
FIG. 1 is a block diagram of a command and data subsystem in a spacecraft.

FIG. 1 shows a command and data subsystem 100 utilizing an RSDL module 102 according to one aspect of this invention. A flight computer 104 controls associated devices over subassembly bus 106. The flight computer 104 is preferably a 1750A low-power computer, but any other similar computer suitable for space installation can be used. The flight computer 104 is interfaced with a critical control (CRC) relay assembly 108, which controls many of the controlled functions performed by the spacecraft. The CRC assembly 108 is controlled by a hardware command decoder module 110. The CRC assembly 108 includes a plurality of latching-type relays, which are highly noise immune and very reliable. The CRC assembly 108 is used, for instance, to control the payload, or in other circumstances where high reliability is necessary. The hardware command decoder module 110 carries out uplink processing, interfacing with the program-storing programmable read only memory ("PROM"), and fault detection.

The command and data subsystem 100 starts up from a start-up memory, here PROM 112. The PROM 112 includes the error detection and correction program and assembly. The present invention can operate with any well-known error detection and correction system.

The RSDL module 102 controls downlink coding using the Reed-Solomon protocol. The RSDL module 102 is one of the described systems according to the present invention. The RSDL module 102 carries out several functions, including: interfacing with the subassembly bus 106, timing and controlling of the RSDL module 102, generation of a synchronization pattern for the downlink data frames, encoding of the downlink data using the Reed-Solomon protocol, generation of clock frequencies used throughout space-craft command, and arbitration of the subassembly bus 106. The techniques of operation described herein allow all of these functions to be combined into a single 256 pin IC chip. The way in which this is carried out is described in detail herein.

A solid state recorder interface unit (SSRIU) 114 forms an interface between the solid state recorder (SSR) 115 and the RSDL module 102. The RSDL module 102 can also be interfaced to a Reed-Solomon (RS) memory buffer 116, RF transmitter 118, telemetry control units (TCUA and TCUB) 120, launch vehicle 122, and Command and Data Subsystem (CDS) bus 122. Cross String Bus Adaptors (XBAs) act as a remote terminal on the CDS bus 126 and allow communication of engineering and science data to the subassembly bus 106.

II. THE RSDL MODULE

A. Architecture and Functional Blocks

Figure 2:
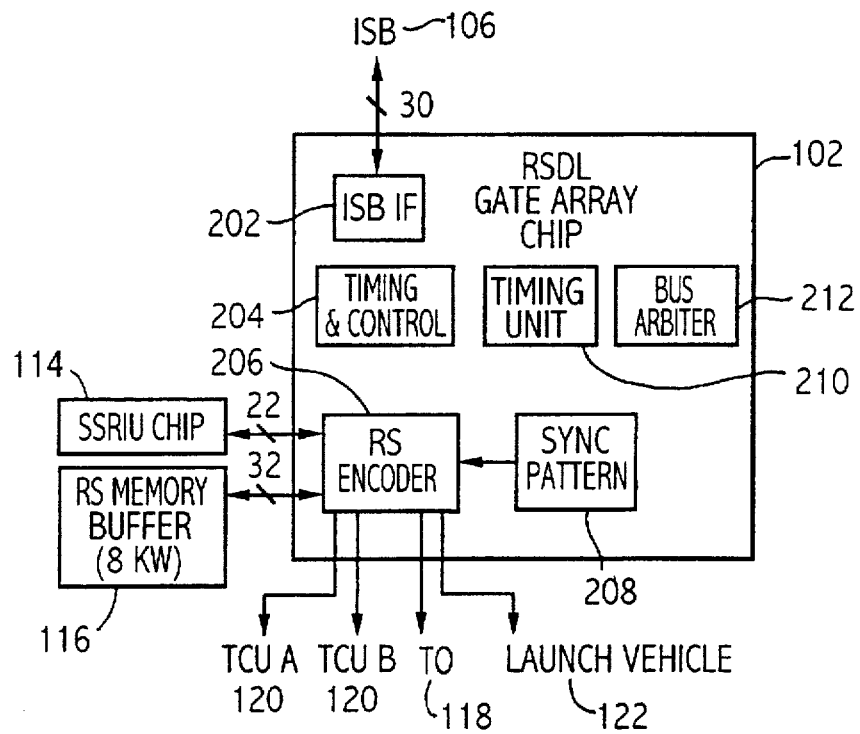
FIG. 2 is a functional block diagram of an RSDL module in accordance with the present invention.

FIG. 2 shows a functional block diagram of the RSDL module 102 of the present invention. The RSDL module 102 is used to encode downlink data sent from the spacecraft, on which the RSDL module 102 is installed, to a ground station (not shown). The RSDL module 102 comprises several functional blocks, including a subassembly bus interface 202, a timing and control unit 204, a Reed-Solomon encoder 206, a synchronization pattern unit 208, a timing unit 210, and a bus arbiter 212.

In accordance with the present invention, the architecture of the RSDL module 102 provides for all six functional blocks (i.e., blocks 202, 204, 206, 208, 210, and 212) to be integrated in a highly efficient manner, such that all blocks can fit on a single 256 pin IC chip. The techniques of the present invention allow economies that facilitate this packaging. As stated above, the RSDL module 102 is interfaced with the SSRIU 114, the RS memory buffer 116, and the flight computer 104 to forward telemetry transfer frames to the RF transmitter 118 on the spacecraft.

The single chip RSDL module 102 of the present invention provides several novel advantages, including the following: (1) a Consultive Committee for Space Data Systems (CCSDS) coding standard with a (255, 223) Reed-Solomon code of interleave 5; (2) a hardwired sync pattern based on the CCSDS standard; (3) all timing and controls necessary for the RSDL module 102; (4) easy interfacing to memory to accumulate check bytes for error detection and correction; (5) a handshaking technique to request encoding data (in words); (6) a spacecraft time with resolution down to 61.031 microseconds; (7) a timing unit that uses separate counters and both an oscillator and a pseudo signal to drive counters; (8) a correlation between spacecraft time and the first bit of a defined transfer frame; (9) easy reconfiguration to a variety of spacecraft projects; (10) internal status and interrupts to the software of the flight computer 104; and (11) bus arbitration based on priority among several different bus masters.

B. The Downlink Data Frame

Figure 3:
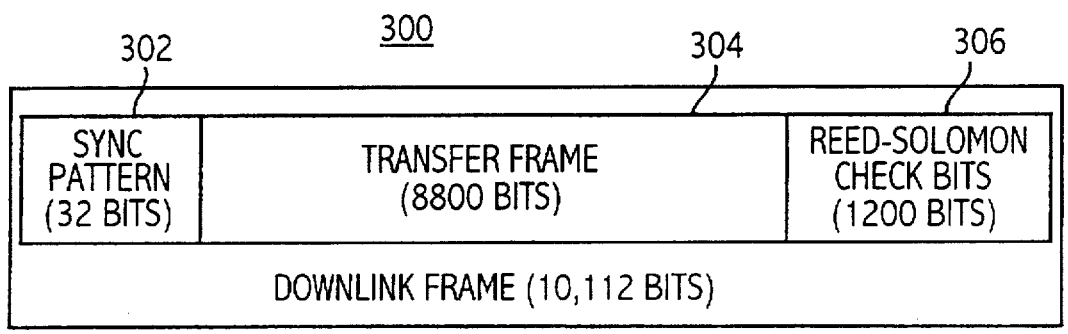
FIG. 3 is a diagram of the format of a downlink data frame.

FIG. 3 shows an example of a downlink data frame 300 in accordance with the present invention. The downlink frame 300 includes a sync pattern 302 (preferably 32 bits), a transfer frame 304 (preferably 8800 bits), and a Reed-Solomon check bit frame 306 (preferably 1280 bits). Thus, in the preferred embodiment, the entire downlink frame 300 has 10,112 bits. The RSDL module 102 appends the sync pattern 302 to the front of a transfer frame 304 and the RS check bit frame 306 to the end of the transfer frame 304.

Preferably, the sync pattern 302 has the value 1ACF FC1D hex, although it could be set to other patterns or be variable. The sync pattern 302 is used at the ground station to determine the start of each downlink frame 300.

The transfer frame 304 includes the data that is sent to the ground station. The transfer frame 304 has source packets, which are composed in the various science and engineering subsystems, or in a command and data subsystem. The size of the transfer frame 304 can be made programmable by the hardware in the RSDL module 102, although the baseline is preferably 8800 bits. The flight software can be designed such that it supports changing the size of the transfer frame 304 during flight of the spacecraft.

Each transfer frame 304 may be encoded according to a Reed-Solomon protocol, or may remain uncoded. The flight software includes a provision such that RS encoding is bypassed. If so, a downlink data frame 300 only includes the synchronization pattern 302 and the unencoded transfer frame 304. The RS check bits 306 in this case are not needed and are not added to the downlink transfer frame 300. The transfer frame 304 may have a short frame length if RS encoding is bypassed.

The RS check bit frame 306 includes check bits that provide error detection and correction on the transfer frame 304. The check bit frame 306 can be designed such that it either does or does not cover the sync pattern frame 302. As with the transfer frame 302, the hardware of the RSDL module permits the RS encoding to be disabled during flight. The flight software can be designed such that it will permit disabling of RS encoding.

The RSDL module 102 stores the check bits 306 in the RS memory buffer 116. The RS memory buffer has 32,000 words (16-bit words) of RAM. This RAM is not accessible via the subassembly bus 106. Thus, the flight software cannot access this RAM.

Figure 4:
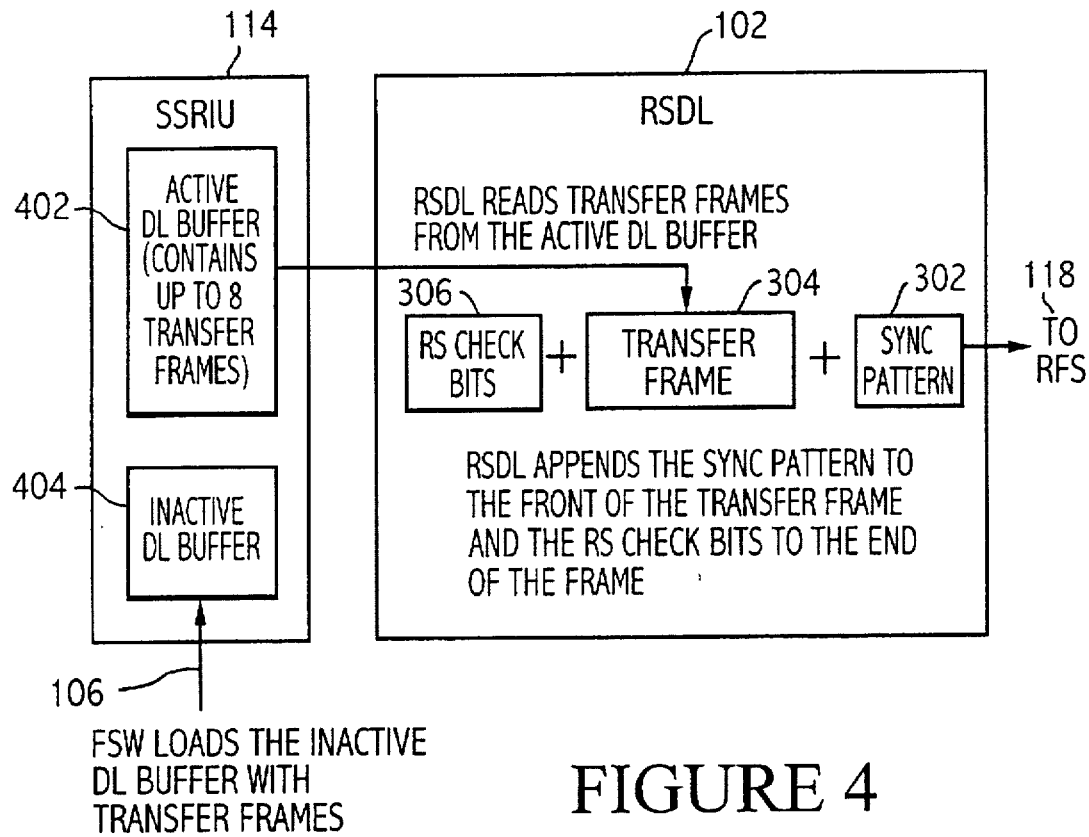
FIG. 4 is a functional block diagram illustrating how a downlink data transfer frame is moved through the RSDL module.

Two sources of data may generate the downlink frame 300: (1) real time data and (2) playback data from the SSR 115. FIG. 4 shows composition of a downlink frame 300 for real time data. The flight software moves the transfer frame 304 into a downlink buffer 402 in the SSRIU 114 via the subassembly bus 106. The flight software programs the SSRIU 114 such that the downlink buffer 402 is filled with playback data from the SSR 115. The RSDL module 102 first sends the sync pattern to the TCUs 120 at the start of a downlink frame 300. The RSDL module 102 then reads the transfer frame from the SSRIU 114 and sends it to the TCUs 120. The RSDL module 102 calculates the RS check bits 306 and accumulates them in the RS memory buffer 116 as the transfer frame 304 passes through the RSDL module 102. The RSDL module 102 sends the RS check bits 306 to the TCUs 120 at the end of the transfer frame 304.

The SSRIU 114 may include at least two downlink buffers 402, 404. One of the buffers will be active at any time. For example, if downlink buffer 402 is active, RSDL module 102 reads transfer frames 304 from downlink buffer 402. Downlink buffer 404 is inactive at this time, allowing the flight software to load downlink buffer 404 with transfer frames. The active downlink buffer may contain up to, for example, 8 transfer frames.

The downlink data rate is programmable. This is described in detail below. Preferably, the maximum downlink data rate is 249 Kbps, and the minimum is 5 bps.

The downlink data frame 300 and the clock signal, which is six times that of the data rate clock, are sent to both TCUs 120. The TCUs 120 select which data and which clock signal to use. The downlink data frame 300 is changed at the falling edge of the clock signal.

The downlink data frame 300 and the data rate clock are sent to the RF transmitter 118 along with two additional signals. The first such signal is the real-time interrupt (RTI) signal. The second signal is the dead period (DEADP) signal. Both of these signals are described in detail below. Here, the downlink data frame 300 is changed at the rising edge of the data clock.

Figure 4A:
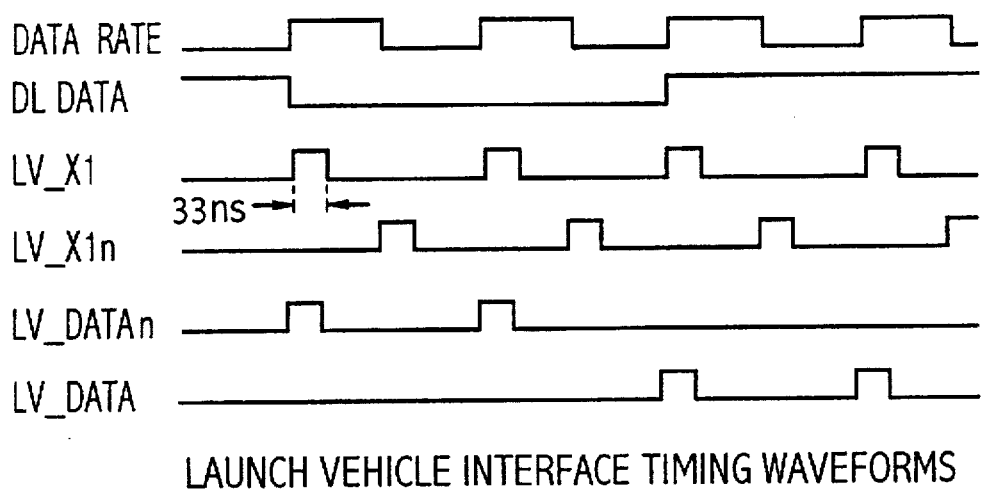
FIG. 4A shows the launch vehicle interface timing waveforms.

The downlink data frame 300 and the data rate clock are sent to the launch vehicle 122. All signals going to the launch vehicle interface have a 4 12 MHz-cycle pulse width ($\approx$334 ns) and have the waveforms shown in FIG. 4A.

C. Functional Blocks

The following is a description of the functions performed by the functional blocks (shown in FIG. 2) contained in the RSDL module 102. Additional discussion of the functional blocks is provided below in the "operation" section.

1. Subassembly Bus Interface Block

The flight software interfaces with the RSDL module 102 through the subassembly bus interface 202. All read/write functions within the RSDL module 102 are controlled by the flight software and are performed through the subassembly bus interface 202. The subassembly bus interface 202 also provides interfacing with the flight computer 104 and/or the XBAs 124.

Figure 5:
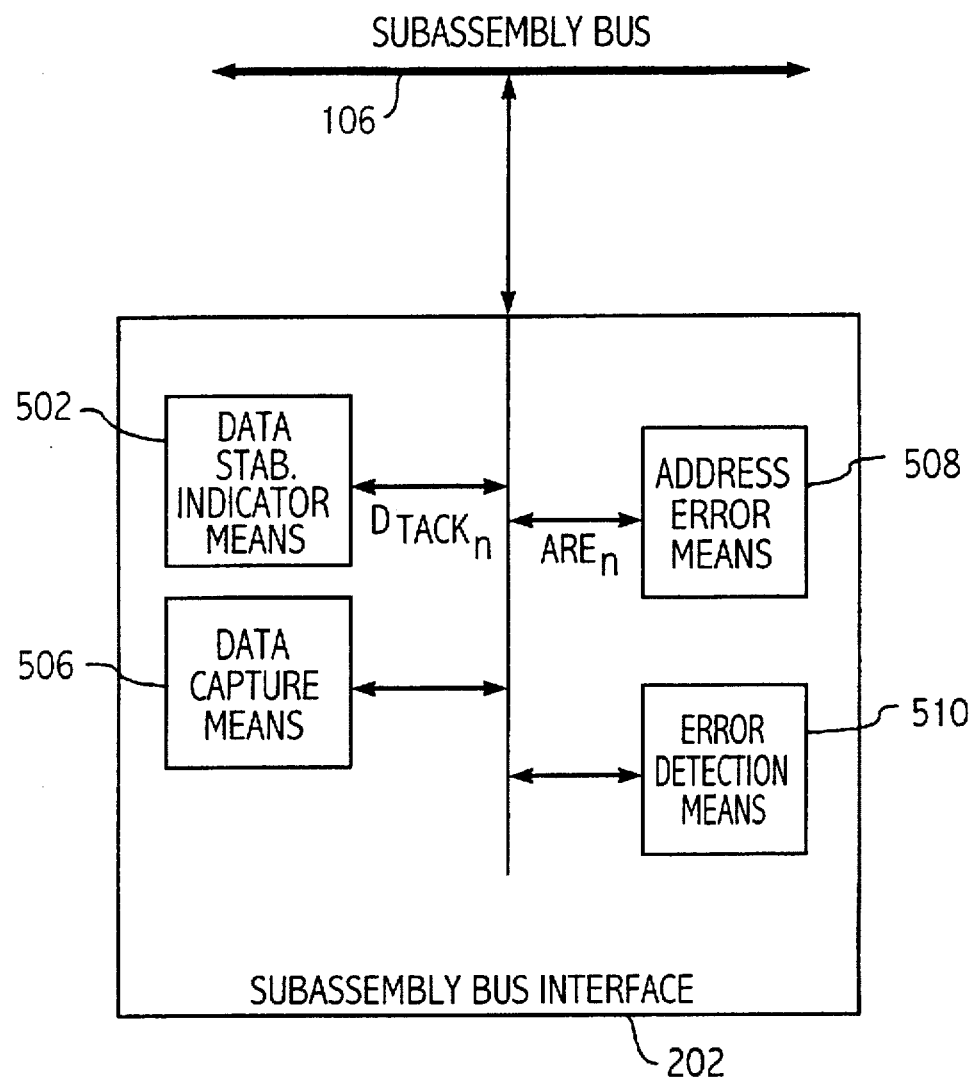
FIG. 5 is a block diagram of a subassembly bus interface within the RSDL module.

The subassembly bus interface 202 also generates a signal indicating when the RSDL module 102 has successfully performed read and write functions. FIG. 5 shows that a stable data indicator 502 determines and indicates whether data is stable during a write cycle at the data pins on the RSDL module 102 by asserting a data transfer acknowledge (DTACKn) signal. The DTACKn signal indicates that data transfer is complete. A data capture device 506 asserts a DTACKn signal during a write cycle when data written by the RSDL module 102 has been correctly captured.

The subassembly bus interface 202 also includes an address error device 508. Preferably, 256 data registers are reserved for the RSDL module 102, only 14 of which are used. (The data registers of the RSDL module 102 are described in further detail below.) When the subassembly bus 106 references an undefined address from among the 256 registers (i.e., an address other than one of the 14 registers that are used), the address error device 508 generates an Address Range Error (AREn) interrupt signal. This signal, in turn, sets Bit 9 of the RSDL Interrupt Register (Register 1, described below) to logic level 1, and an RSDL Interrupt (RSDL_INTn) signal is generated. No DTACKn signal is returned when an AREn signal is asserted, because the AREn signal indicates that data transfer is not completed.

The subassembly bus interface 202 also includes a parity error detector 510. The parity error detector 510 checks odd data parity on a write cycle. A write operation is inhibited if a parity error occurs. Both the DTACKn signal and a Data Parity Error (DPEn) signal are asserted when a data parity error occurs. In addition, the RSDL_INTn signal is asserted when a data parity error occurs, and Bit 8 of the RSDL Interrupt Register is set to logic level 1. The parity error detector 510 can also check data parity bits before a write cycle.

Figure 5C:
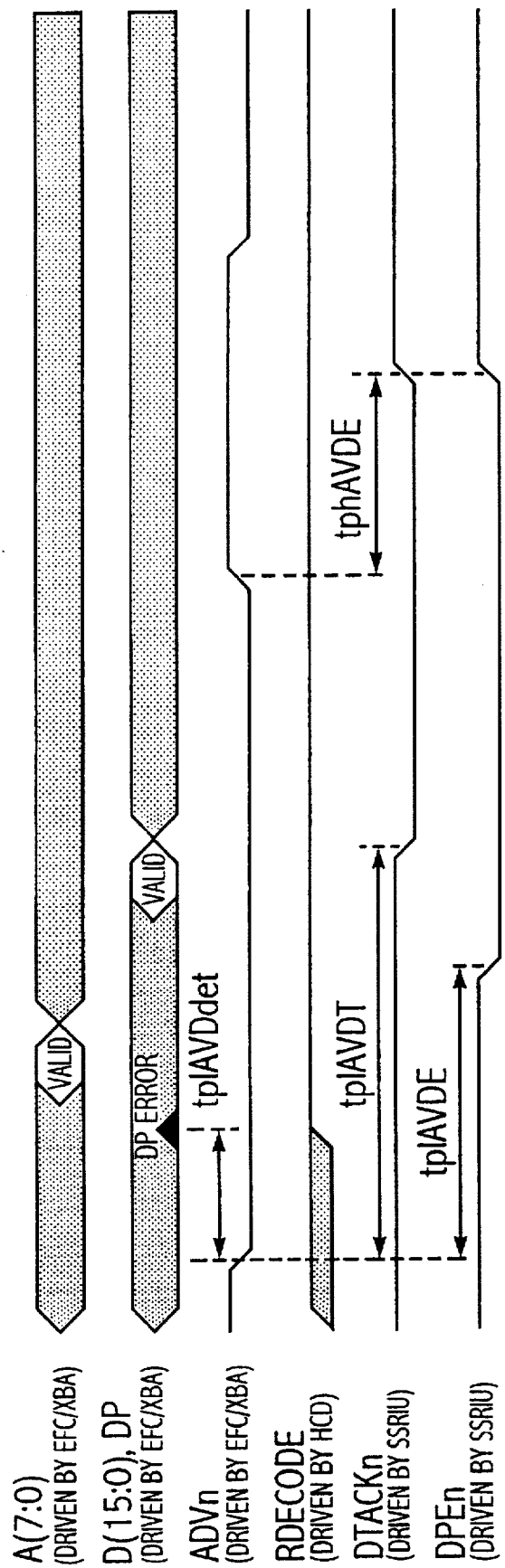
FIG. 5C shows the protocol for the write cycle of the subassembly bus with data parity error.
Figure 5D:
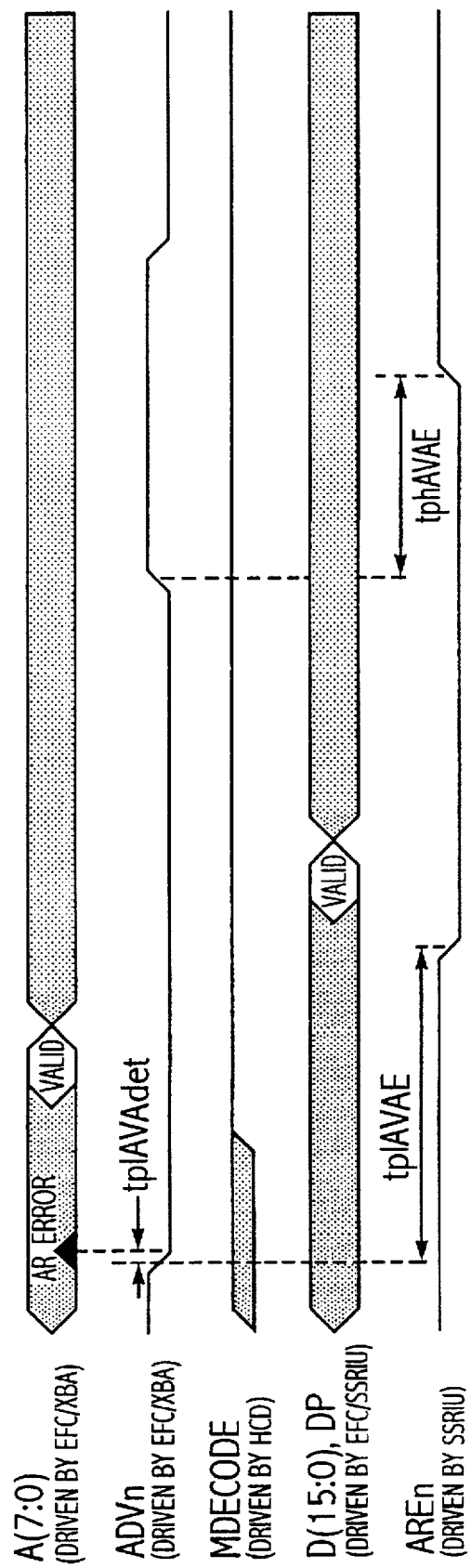
FIG. 5D shows the protocol for read/write cycles of the subassembly bus with an address range error.

FIGS. 5A–5D show read and write protocols for the subassembly bus interface 202. The protocol for the subassembly bus interface 202 read and write cycles, with no errors, are shown in FIGS. 5A and 5B, respectively. The protocol for the subassembly bus interface 202 write cycle, with data parity error, is shown in FIG. 5C. The protocol for the subassembly bus interface 202 read/write cycles, address range error, is shown in FIG. 5D.

2. Timing and Control Unit

Figure 6:
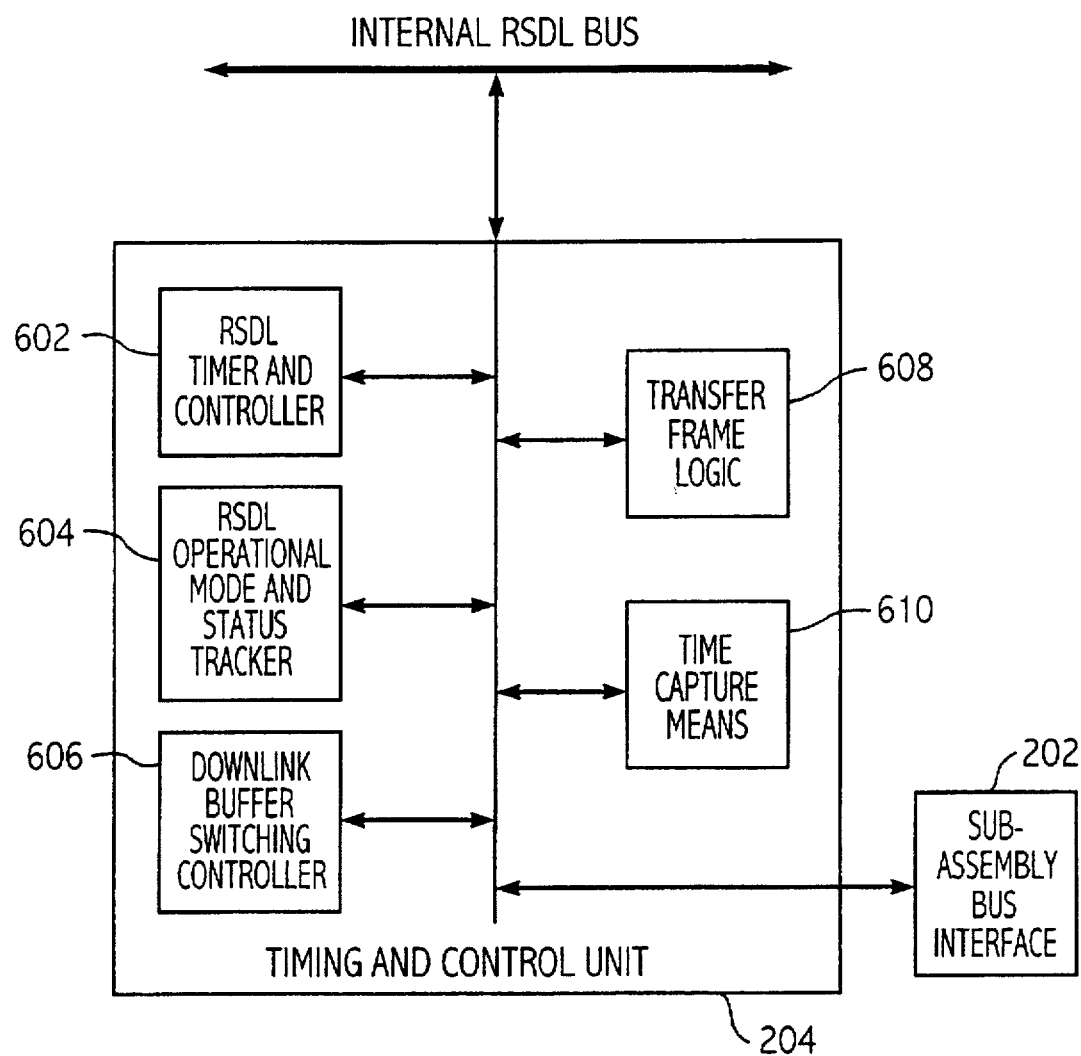
FIG. 6 is a block diagram of a timing and control unit within the RSDL module.

The RSDL module 102 also includes a timing and control unit 204, which is illustrated in greater detail in FIG. 6. The timing and control unit 204 includes a timing and control generator 602 for generating timing and control for the RSDL module 102. The timing and control unit 204 also includes a mode and status device 604 for keeping track of the operational mode and status of the RSDL module 102. The timing and control unit 204 further includes a controller 606 for controlling switching between downlink data buffers 402, 404. Finally, the timing and control unit 204 has logic 608 for forcing transfer frames 304 to synchronize with a specified Realtime Interrupt (RTIn) signal and to use a specified downlink data buffer when synchronization occurs. (The RTIn signal is explained in detail below.)

Figure 7A:
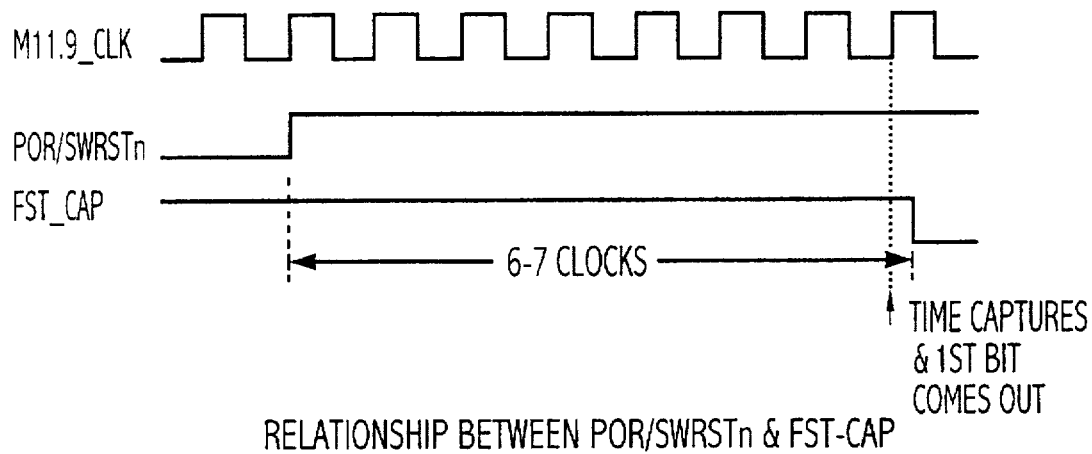
FIG. 7A is a timing diagram showing the relationship between signals for capturing the time when a first frame of downlink data is output.
Figure 7B:
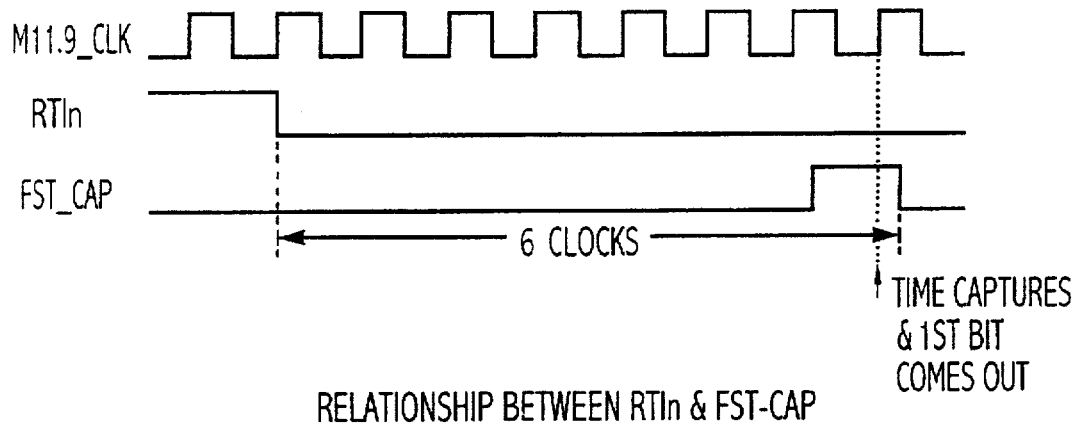
FIG. 7B is a timing diagram showing the relationship between signals for capturing the time when a first frame of downlink data is output.

The timing and control unit 204 also has a time detector 610 for capturing a time when the first frame of a downlink data buffer 402, 404 is output by the RSDL module 102. This time is captured as follows. The Frame Start Register (Register 10) of the RSDL module 102 captures the exact time whenever the first bit of the first frame of a downlink buffer 402, 404 is sent out from the RSDL module 102. The relationship between (1) a Power On Reset (PORn) signal and Software Reset (SWRSTn) signal and (2) a First Frame Stamp Capture (FST_CAP) signal is shown in FIG. 7A. The relationship between RTIn and FST_CAP is shown in FIG. 7B. The first bit of the first downlink data frame (i.e., frame start time) output by the RSDL module 102 is valid 6 to 7 clock cycles (approximately 500 to 586 nanoseconds) after reset. The frame start time is valid 6 clock cycles (approximately 500 ns) after RTIn is asserted.

3. Reed-Solomon Encoder Block

The RSDL module 102 further includes a Reed-Solomon encoder block 206. The RS encoder block 206 includes an RS encoder, which is based on the design of E. R. Berlekamp, in known fashion. The code used in the RSDL module 102 of the present invention is defined as (255, 233) code with interleave depth of 5. This code is well-known and defined by the CCSDS standard. Those skilled in the art will recognize that other codes and interleave depths could alternatively be employed.

The RS encoder block 206 also includes a multiplexer for selecting input from either a clock in the synchronization pattern block 208 or the SSRIU 114. The RS encoder block 206 interfaces directly with the RS memory buffer 116 with internal addresses. In addition, the RS encoder block 206 has the capability to bypass RS encoding when the flight software specifies.

The RS encoder block 206 requires only 128 words of RAM to calculate the RS check bits 306. The RS memory buffer 116 (i.e., the RAM accessed by the RS encoder 206) has 32,000 16-bit words of data storage. The lower 8 k of the RAM is broken up into 64 segments, with 128 words/segment, rather than not using most of the RAM. Only one segment is used if no cell failures occur within the RS memory buffer 116. The RSDL module 102 can be programmed to use a different segment of RAM, however, if a cell does fail in the RS memory buffer 116.

As stated above, RS encoding can be turned on and off. The RS check bits 306 are generated when RS encoding is turned on and are appended to the end of each downlink data frame 300. A downlink data frame 300 is smaller by 1280 bits when RS encoding is turned off, because the RS check bits 302 are not generated and appended to the frame 300.

4. Synchronization Pattern Block

The synchronization pattern block 208 of the RSDL module 102 is preferably hardwired logic for generating a fixed hexadecimal synchronization pattern. The preferred fixed synchronization pattern is 1ACFFC1D hex.

It should be recognized, however, that the synchronization pattern unit 208 could alternatively be software or a combination of hardware and software. Further, the synchronization pattern unit 208 could be designed such that it generates various or selected synchronization patterns, rather than a fixed pattern, where the pattern is varied or selected depending on a variety of factors. In the preferred embodiment, the synchronization pattern unit 208 is designed such that it is controlled by the timing and control unit 204. It is also designed to receive data from downlink buffers 402, 404 and to shift the synchronization data out serially for every downlink frame, starting with the most significant bit (MSB), to the RS encoder block 206.

5. Timing Unit

Figure 8:
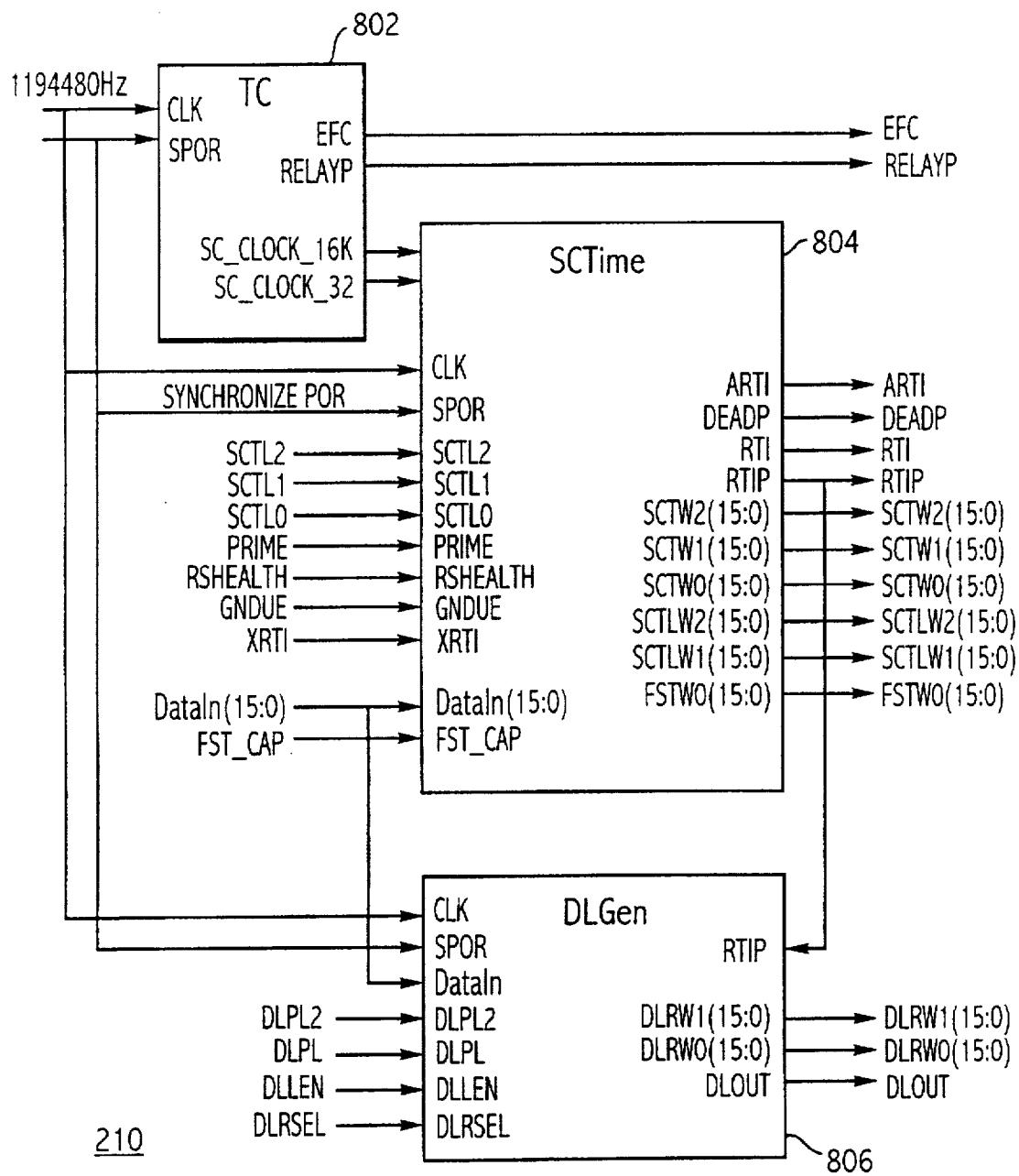
FIG. 8 is a block diagram of a timing unit within the RSDL module.

The timing unit 210 generates clock frequencies used throughout the command and data subsystem 100. FIG. 8 shows that the timing unit 210 is divided into three sections: fixed Timing Chain (TC) section 802, Spacecraft Time (SCTime) section 804, and Downlink Frequency Generator (DLGen) section 806.

The TC section 802 converts the system clock of 11,944, 800 Hertz into most of the frequencies needed for the command and data subsystem 100. All frequencies generated by the TC section 802 are derived from a fixed timing chain.

Figure 9:
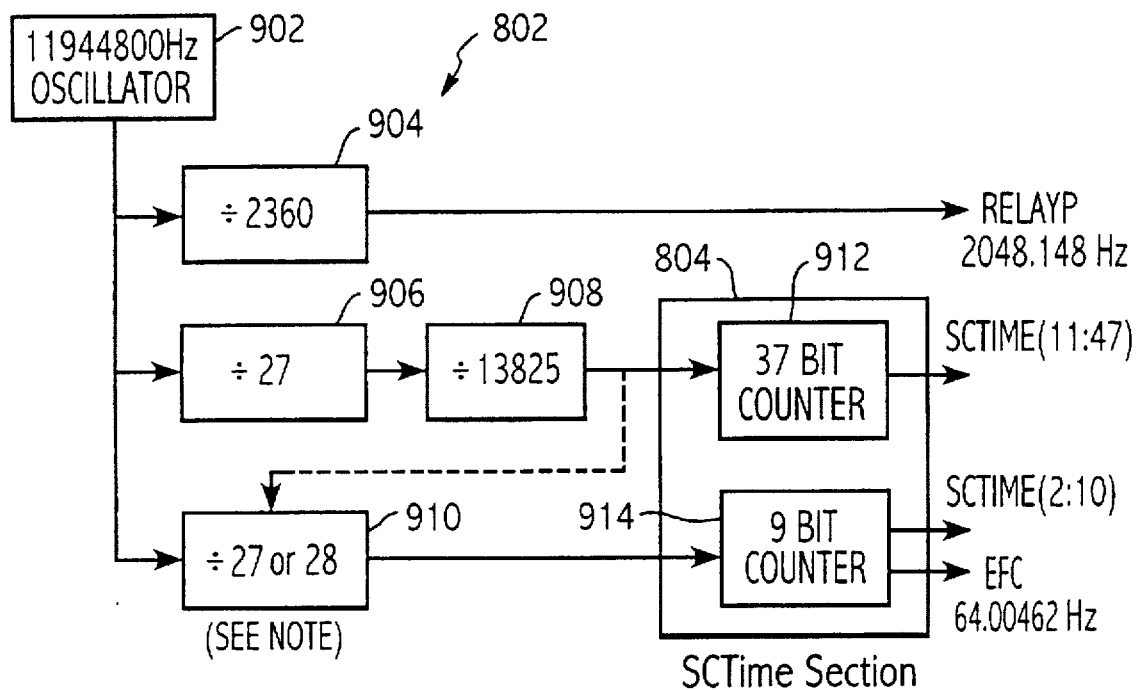
FIG. 9 is a diagram of a timing chain and spacecraft timing sections within the timing unit.

FIG. 9 shows the blocks comprising the TC section 802, including a 11,944,800 Hz oscillator 902 and counters 904, 906, 908, 910. FIG. 9 also shows how the elements of the TC section 902 interface with the SCTime section 904. The first counter 904 receives the timing signal from the oscillator 902 and divides that signal by 2360. The first counter 902 then outputs a relay signal of 2048.148 Hz, with a 1.004 µs pulse width, which is used by the CRC assembly 108. The second counter 906 receives the timing signal from the oscillator 902 and divides that signal by 27. That divided signal is output to the third counter 908, which then divides by 13825. The third counter 908 then outputs the resultant 32 Hz signal to the SCTime section 804, which uses this signal internally. The SCTime section 804 includes a 37 bit counter 912, which outputs an SCTime signal, as shown.

The fourth counter 910 also receives the timing signal from the oscillator 902 and divides that signal by 27 or 28. The fourth counter 910 divides by 27 for 511 ns pulses and by 28 for the 512 ns pulse. (This will be described in further detail below.) The fourth counter 910 then outputs the divided signal (a 16,384 Hz pseudo signal) to a 9 bit counter 912 in the SCTime section 804. The 9 bit counter 914 then outputs a higher resolution SCTime signal, as shown. This higher resolution time signal provides 9 additional bits of spacecraft time resolution over the spacecraft time signal generated by the 37 bit counter 912. In this case, the 9 bit counter 914 outputs subseconds. Counter 914 also outputs an Engineering Flight Computer timing signal of 64.00462 Hz, with a pulse width of 1.004 µs.

The SCTime section 804 contains the counters and registers used to set and read the spacecraft clock, to record the frame start time, and to generate the ARTI, RTI, and DEADP signals (which will be described further below). The frame start time means the time of the first frame of every downlink buffer.

The spacecraft clock is functionally a 46 bit counter, which comprises the combination of the 37 bit counter 910 and the 9 bit counter 912. The spacecraft clock keeps track of time from 0 to 4,294,967,295.999 seconds (approximately 136 years) in 61.031 µs intervals. The spacecraft counter is preferably never reset. It retains its previous value after a warm boot. It contains a random value after a cold boot (power-up). The time format is split into three 16 bit words. Two of the three words represent the number of elapsed seconds ("second elapsed words"), while the third word holds the elapsed subsecond count ("subsecond elapsed word"). Only the most significant 14 bits of the subsecond elapsed word are used, with the two least significant bits being permanently set to logic 0. These spacecraft time words are mapped to Registers 7, 8, and 9 (described below) of the RSDL module 102.

The actual value of the spacecraft time counters are driven directly onto the subassembly bus 106 when either of the second elapsed words is read. The value of the counter is loaded into a buffer register ("subsecond buffer register"), which prevents the subsecond bits from transitioning during a read cycle. The subsecond buffer register is loaded continuously, except during a subsecond elapsed word read, when the loading of the subsecond buffer register is disabled. Thus, the spacecraft subsecond time is obtained exactly at the beginning of the memory read cycle of the subsecond buffer register.

The subsecond elapsed word is also loaded into a separate frame start register when signaled by the RSDL module 102. This register allows the RSDL hardware to record the start time of the first frame of every downlink buffer 402, 404. This value does not change until the downlink buffer is switched from one buffer (e.g., downlink buffer 402) to the other (e.g., downlink buffer 404). The frame start register is read by the flight software.

The SCTime section 804 also generates the RTIn, ARTIn, and DEADP signals. These signals are derived directly from the spacecraft clock. The RTIn signal (the real time interrupt signal) is derived from the 0 to 1 and 1 to 0 transitions of the ⅛th second bit in the spacecraft clock. Thus, RTIn occurs at a rate of 8 per second. The RTIn signal is connected to a Software Interrupt input on a fault detection unit, which is part of the hardware command decoder module 110. The occurrence of RTIn causes the subassembly bus interrupt signal to be asserted by the flight computer 104 when RTIn is left unmasked. This produces an interrupt in the flight computer 104. The cause of the interrupt can be determined via the flight software and registers in the flight computer 104. The ARTIn signal (the asynchronous real time signal) is derived from the spacecraft time counter and occurs approximately 5 ms before the RTI signal. Both the RTIn and ARTIn signals have approximately a 1.004 μs pulse width. The DEADP signal (dead period signal) is the time between the end of the ARTI signal and the beginning of the RTI signal. The DEADP signal is active from the end of the ARTIn pulse to the beginning of the RTIn pulse.

Preferably, the flight software performs three read cycles to read the spacecraft time. The three word value of spacecraft time read by the flight software may be corrupted if RTIO happens at any time during these read cycles. The flight software can handle prevention and/or detection of spacecraft time corruption. Further, the flight software can prevent spacecraft time corruption by ensuring that RTIO never occurs during the three word read of spacecraft time.

Another counter can be driven by a power-of-two frequency higher than 32 Hz in order to resolve times under 1/32 second. A frequency is generated by counter 910 that is a pseudo 16,384 Hz signal, because no such frequency can be directly derived from the 11,944,800 Hz oscillator 902. This pseudo signal toggles exactly 512 times over a 1/32 second time period (i.e., 16,384 times per second). Another 9 binary bits of spacecraft time resolution (in this case subseconds) can be obtained by using the pseudo signal to drive a separate counter 914. The period of one of the 512 ns time pulses is longer than the rest by a factor of 28/27 to achieve this pseudo 16,384 Hz signal. (See the fourth counter 908 in FIG. 9 and description above.)

One of the counter transitions will represent a longer time interval than other transitions. This is because the pseudo 16,384 Hz signal is being used to force the transitions of the least significant bit (LSB) of a counter, and because one of these 512 ns pulses has a longer period than the other pulses. The time elapsed is approximately 63.291 μs when the 9 bit counter 912 transitions from 000000001 to 000000010. Every other transition, however, occurs at an interval of approximately 61.030 μs. This allows for the subsecond count to be accurate (because 512 transitions equals exactly 1/32 second) and deterministic for time measurements under 1/32 second.

Figure 10A:
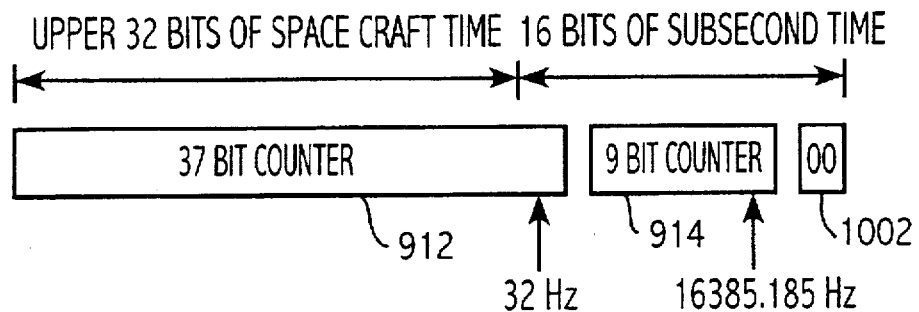
FIG. 10A shows the counters in the timing unit used to generate the 46-bit spacecraft time signal.

FIG. 10A shows how the 37 bit counter 910 and the 9 bit counter 914 are used to produce the 46 bit spacecraft time. The upper 32 bits of spacecraft time (i.e., the second count bits) are held in the 32 MSBs of the 37 bit counter 912, which is clocked by the 32 Hz timing signal. The upper 5 bits of subsecond spacecraft time are held in the 5 LSBs of the 37 bit counter 912. The nine next highest bits of subsecond spacecraft time are held in the 9 bit counter 914, which is clocked by the 16,385.185 Hz signal. The two LSBs 1002 of spacecraft time, as explained above, are set to logic 0.

Figure 10B:
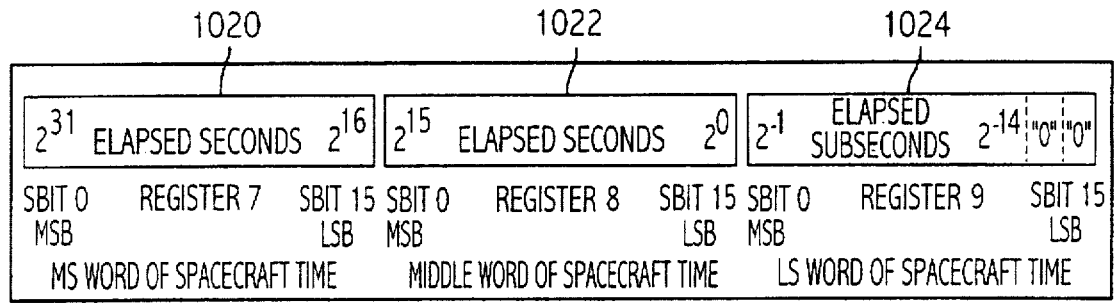
FIG. 10B shows the registers used to store spacecraft time.

FIG. 10B shows three registers 1020, 1022, 1024 into which the 46-bit spacecraft time can be mapped. Preferably, these are Registers 7, 8, and 9 of the 256 data registers reserved for the RSDL module 102. Register 1020 (i.e., Register 7) contains the 16 MSBs of spacecraft time. Register 1022 (i.e., Register 8) contains the middle 16 bits. Register 1024 (i.e., Register 9) contains the 14 LSBs. The two LSBs in register 1024 (Bits 14 and 15) are always set to logic level "0". Registers 1020 and 1022 contain bits representing the elapsed seconds of spacecraft time. Register 1024 contains elapsed subseconds.

Preferably, only 32 of the 46 bits of spacecraft clock time are loaded. That is, the spacecraft time is only loadable to a 1 second resolution. The two word spacecraft time is loaded into holding registers and is transferred to the actual spacecraft clock when time load conditions are met. Conditions for loading the timing unit 210 are given in the following truth table:

TABLE 1

| PRIME | Redundant String Health | Ground Update Enabled | TU_SWTLEN | S/C Time is Loaded at Next |
|---|---|---|---|---|
| true | don't care | true | true | RTI |
| false | true | don't care | true | XRTI |
| false | false | true | true | RTI |

Table 1 shows two timing signals, RTIn and XRTIn, that can be used to initiate spacecraft time loading. The RTIn signal is generated in the timing unit 210 and allows the time to be loaded on a second boundary (assuming software only allows a load on RTI 0). The XRTIn signal is a crossstrapped RTI that is generated in the XBA 124. The XRTIn signal is broadcast to a secondary command and data subsystem (CDS) string from a prime CDS string and allows a secondary timing unit to synchronize its time to the primary timing unit 210.

The PRIME and Ground Update Enable inputs are Critical Controller (CRC) bits. The PRIME signal indicates whether the CDS string is a primary or secondary CDS string. The PRIME signal comes from the hardware command decoder module 110. The Ground Update Enable signal is used to indicate if the ground wants to update spacecraft time. The Ground Update Enable signal must be set before and cleared after each new time is loaded, if the signal is being used to allow loading of a new time. Multiple ground directed loads will not occur by leaving the Ground Update Enable bit set.

The Redundant String Health (RSHEALTH) signal comes from the hardware command decoder 110 and reports on the redundant CDS string health. The TU_SWTLEN bit is Bit 4 in the RSDL Status and Timing Unit Control Register (Register 0). The TU_SWTLEN bit is used in the timing unit 210 to load the 32 MSBs of spacecraft time. TU_SWTLEN bit is set by software to allow a new time to be loaded, assuming all other conditions are met. The TU_SWTLEN bit is automatically cleared when the spacecraft time is actually loaded.

The new two-word spacecraft time is loaded into the upper 32 bits of the spacecraft block counter at the next RTIn when the timing unit 210 is in the PRIME state and the Ground Update Enable and TU_SWTLEN bits are set. If timing unit 210 is secondary, if the RSHEALTH is asserted, and if the TU_SWTLEN bit is set, then the new two-word space craft time is loaded into the upper 32 bits of the spacecraft clock counter and all sub-second bits are cleared at the next occurrence of XTRIn. This allows for synchronization of the secondary with the prime CDS string. This result will occur regardless of the state of the Ground Update Enable bit.

If, on the other hand, timing unit 210 is secondary, but the RSHEALTH signal is not asserted, and if the Ground Update Enable and TU_SWTLEN bits are set, then the new two-word spacecraft time is loaded into the upper 32 bits of the spacecraft clock counter at the next RTIn. This allows for the ground to load the secondary from the ground when the prime CDS string is bad.

The DLGen section 806 generates the downlink output signal (DLOUT). DLOUT is divided by 12 to obtain a x12 downlink data rate signal. This x12 signal is used in generating the downlink data transmission rate. The DLGen section 806 has both a fixed and a programmable downlink data rate. The fixed data rate is automatically selected after a PORn signal and sets a downlink data transmission rate of 5 bits per second (bps). The programmable data rate option allows selection of downlink data transmission rates from 5 to 248.850 bps (corresponding to DLOUT frequencies of 60 to 2,986.200 bps). The selection of a fixed or programmable data rate is controlled by a downlink data rate select bit (DLRSEL), which is Bit 5 in the RSDL Status and Control Register (Register 0).

Figure 11:
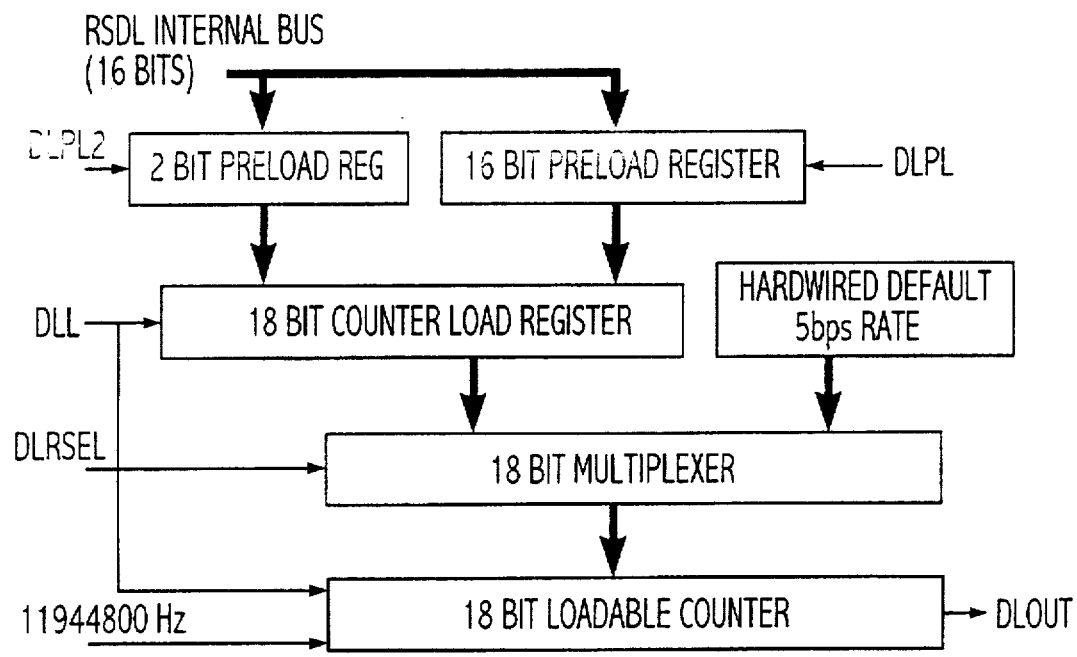
FIG. 11 shows the registers and counters in the downlink generator section of the timing unit used to generate the downlink data rate.

FIG. 11 shows the DLGEN section 806 in greater detail. The DLGen section 806 is coupled to an internal bus 1102 in the RSDL module 102. The internal bus 1102 may be a 16-bit bus, as shown. The internal bus 1102 is coupled to a 2-bit preload register 1104 and a 16-bit preload register 1106. The internal bus 1202 inputs data into those two registers 1104, 1106. The two registers 1104, 1106, are, in turn, coupled to an 18-bit counterload register 1108. Registers 1104, 1106 input the programmable data rate into the 18-bit counterload register 1108. The DLGen section 806 also includes hardwired logic 1110 for setting the default downlink data transmission rate of 5 bps. An 18-bit multiplexer 1112 multiplexes between the 18-bit counterload register 1108 and the hardwired logic 1110, depending on the DLRSEL signal. Accordingly, the 18-bit multiplexer 1112 is used to select either the programmable data rate or the fixed data rate of 5 bps. The 18-bit multiplexer 1112 inputs the selected data rate into an 18-bit loadable counter 1114, which is timed by the 11,944,800 Hz spacecraft timing signal.

Preferably, the DLGen section 806 is implemented as a software loadable frequency divider. This design takes the 11,944,800 Hz system frequency and divides it to the x12 frequency used by the RSDL module 102. The frequency divider is an 18-bit wide counter 1114 that is loaded from the downlink preload registers 1104, 1106. The divided value will be transferred from the preload registers to the downlink rate counter 1114 at the next RTIn signal by setting the downlink rate load bit (Bit 6) in the RSDL Status and Control Register (Register 0).

6. Bus Arbiter Block

Figure 12:
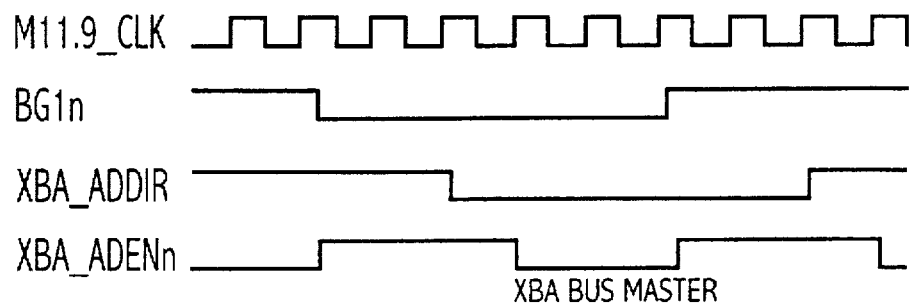
FIG. 12 is a timing diagram for the control signals of the board address bus.

The bus arbiter block 212 provides logic to control the subassembly bus 106 and generates control signals to enable a 2A2 Board Address Bus. FIG. 12 shows a timing diagram for the bus control signals. BG is the bus grant signal, which is described below. XBA_ADENn is an address enable signal for the XBA 124. It enables the 2A2Board Address Bus when the XBA 124 is bus master. XBA ADDIR is the XBA bus direction signal that controls the 2A2Board Address Bus direction. The flight computer 104 is the subassembly bus 106 master if XBA ADDIR is logic level "1." The XBA 124 is master is XBA ADDIR is logic level "0."

The bus arbiter 212 performs bus arbitration for the subassembly bus 106 between four possible bus masters. Those skilled in the art will recognize, however, that the bus arbiter 212 can be designed such that it provides bus arbitration for greater or fewer than four bus masters.

Four bus request lines (BR0–BR3) are used to request access to the subassembly bus 106. Each bus request line corresponds to a possible bus master. BR0 has the highest priority, while BR3 has the lowest priority. Corresponding bus grant lines (BG0–BG3) are used to grant access to the subassembly bus 106. The bus request and bus grant lines are preferably active in a low logic state.

The following sequence of events defines how a bus master achieves and maintains access to the bus 106 from the flight computer 104. A bus master first asserts its bus request signal. The bus arbiter 212 then asserts the corresponding bus grant line. The bus master is then given control of the subassembly bus 106 until it deasserts its request signal or is signaled to exit the subassembly bus 106 by a bus grant abort signal generated by the bus arbiter 212.

The bus arbiter 212 has two distinct modes of operation. The first mode describes the arbitration of the subassembly bus 106 between the four bus masters under normal operating conditions. This first mode is referred to as the "normal mode." The second mode describes the "arbitration" of only the XBA bus master. This second mode is referred to as the "hog mode." The hog mode is only active when a "hog line" is asserted.

The normal mode assigns the highest priority for bus access to the flight computer 104, second priority to the XBAs 124, and third and fourth priorities to undefined bus masters. Accordingly, the bus arbiter 212 employs a simple priority mechanism in the normal mode that grants bus ownership to the highest priority bus master. Ownership of the subassembly bus 106 will not change unless another bus master makes an access request. The flight computer 104 can hold the subassembly bus 106 as long as necessary, because it has the highest priority. The flight computer 104 only loses control of bus 106 when it deasserts. All other bus masters are allowed to hold the subassembly bus 106 until they are forced off. This occurs when a bus request signal from another bus master is received by the bus arbiter 212. The bus arbiter 212 issues a bus abort signal when it receives a bus request. The bus arbiter 212 then grants bus access to the higher priority bus master between the prior bus master that was deasserted and the bus master requesting control of the subassembly bus 106.

The bus arbiter 212 grants access in the hog mode only to the XBA bus master 124. All other bus master requests are not recognized by the bus arbiter 212. Preferably, the hog mode is used only for support equipment access to the subassembly bus 106 before launch of the spacecraft. Thus, the bus arbiter 212 forces all other bus masters off the subassembly bus 106 in the hog mode and assigns exclusive use of the subassembly bus 106 to the second priority bus master, here the XBA controller 124.

III. THE RSDL MODULE DATA REGISTERS

The RSDL module 102 has 256 data registers. The registers are numbered from 0 to 255. Each register holds 16 bits of data (or one data word). The most significant bit (MSB) of each register is bit 0, and the least significant bit (LSB) is bit 15.

Register 0 is addressed by the least significant address of the memory range reserved for the RSDL registers. Only 14 registers are used out of 256 reserved for the RSDL module 102. The AREn signal is asserted when the software writes to the unused registers, but no DTACKn is returned to the subassembly bus 106.

Writing to the RSDL registers requires special attention. Most of the registers have a portion of read-only bits, read-write bits, and unused bits. Also, a special bitwrite scheme is used for status, control, mask, and interrupt registers (Registers 0 and 1). The MSB in this special bitwrite scheme has the value to be written to the register. A "1" at all other bits indicates that a bit will be written by the value stored at the MSB, and a "0" indicates that a bit will remain the same. The following examples illustrate the special bitwrite scheme:

| Write to Register i: | 1000 | 0000 | 1111 | 1111 |
|---|---|---|---|---|
| Register i before write: | 0000 | 1111 | 0000 | 1111 |
| Register i after write: | 0000 | 1111 | 1111 | 1111 |
| Write to Register i: | 0000 | 0000 | 1111 | 1111 |
| Register i before write: | 0000 | 1111 | 1111 | 1111 |
| Register i after write: | 0000 | 1111 | 0000 | 0000 |

All the bits in the RSDL registers are classified as follows:

R: Ordinary read
SW: Special write scheme
W: Ordinary write
U: Unused bits. Read back 0 and write don't care.

Register 0 is the RSDL Status and Control Register. Its address is 1 EF500, hex. All bits in Register 0 are equal to 0 after reset, except the mask bits, which are set to 1.

| Bit # | Type | Description |
|---|---|---|
| 0 (MSB) | W | Special bit. This value will be written to all affected bits. Reading this bit will always give 0 value. |
| 1 | SW/R | Buffer Swap Enable. Flight software sets this bit to enable the swapping of the downlink buffers 402, 404. The hardware will clear this bit when the downlink buffer swaps. |
| 2 | SW/R | Sync RTI flag. A "1" at this bit means that the transfer frame 304 needs to be resynchronized when the RTI signal arrives. The flight software sets the flag in normal operation, and the RSDL hardware resets the flag when the RTI occurs. |
| 3 | SW/R | Force Buffer bit. The force buffer (see bit 14) will become the downlink buffer when this flag is set and the Sync RTI occurs. |
| 4 | SW/S | TU SWTLEN bit. This bit is used in the timing unit 210 to load 32 bits into the 32 MSBs of the spacecraft time. This bit is cleared by hardware after the value has been loaded to the spacecraft time. |
| 5 | SW/R | DL Rate Select bit. This bit is used in the timing unit 210. This bit selects which predefined value will be used in the DLGen 806. |
| 6 | SW/R | DL Rate Load bit. This bit is used in the timing unit. When this bit is set and the RTI occurs, the new value of the downlink data rate will be loaded into the DLGen 806. This bit is cleared by the hardware after the value has been loaded. |
| 7 | SW/R | Disabled Buffer Swap Mask bit. When this bit is set, the Disabled Buffer Swap Interrupt signal will be masked. |
| 8 | SW/R | DPEn Interrupt Mask bit. When it is masked, the DPEn error will be saved in the RSDL Interrupt Register (see below) and will assert the DPEn line, but not the RSDL_INTn line. A "1" at this bit means mask out the corresponding interrupt. |
| 9 | SW/R | AREn Interrupt Mask bit. When it is masked, the error will be saved in the RSDL Interrupt Register, and SSRIU 114 will assert the AREn line, but not the RSDL_INTn line. |
| 10 | SW/R | End-of-Buffer Interrupt Mask bit. When masked, this interrupt will be saved in the RSDL Interrupt Register, and the RSDL_INTn line will not be asserted. |
| 11 | SW/R | Start-of-Buffer Interrupt Mask bit. When masked, this interrupt will be saved in the RSDL Interrupt Register, and the RSDL_INTn line will not be asserted. |
| 12 | R | Current DL Buffer ID. 0 selects downlink buffer 402 (the "A" buffer) is selected, and a "1" means that downlink buffer 404 (the "B" buffer) is selected. |
| 13 | R | Current RS Encoding Status. A "0" at this bit means that the RS encoding is on; otherwise RS encoding is off. |
| 14 | SW/R | DL Force Buffer ID. A "0" at this bit means that the A buffer 402. When the Buffer flag is set and Sync RTI occurs, buffer 402 will become the downlink buffer. |
| 15 | SW/R | Next RS Encoding Status. This encoding status will be used when Sync RTI occurs. |

Register 1 is the RSDL Interrupt Register. The address of Register 1 is 1EF501, hex. The bits in this register are set by hardware and cleared by software. Setting any bits in this register will cause the RSDL interrupt signal (RSDL_INTn) to be raised if the corresponding masking bit (i.e., Bit 7 of Register 0) is not set. Bit 7 and Bit 11 of Register 1 are set and all other bits will be cleared after the PORn signal or the software resets. Software is allowed to set the bits in this register for testing purposes in order to invoke interrupt handler routines directly. This capability should not be used, however, in normal (or non-testing) operation.

| Bit # | Type | Description |
|---|---|---|
| 0 (MSB) | W | Special bit. This value will be written to all affected bits. Here, only 0 value affects the register. Reading of this bit will always give a 0 value. |
| 1–6 | U | Spare bits. |
| 7 | SW/R | Disabled Buffer Swap Interrupt. This bit is set when the downlink buffer swaps on itself because the Buffer Swap Enable bit (Bit 1 of Register 0) is disabled. |
| 8 | SW/R | DPEn interrupt bit. This bit is set when the software writes to the RSDL module 102 with a data parity error. |
| 9 | SW/R | Local AREn interrupt. This bit is set when the software accesses an undefined address. |
| 10 | SW/R | Buffer Overflow Interrupt bit. This bit is set when the downlink reads past the end of the downlink buffer 402, 404. In that case, the last word of the downlink buffer will always be returned. |
| 11 | SW/R | Start-of-Buffer interrupt bit. This bit is set when the downlink buffer 402, 404 swaps to another buffer or on itself. |
| 12–15 | U | Spare bits. |

Register 2 is the Current Frame Information Register. The address of Register 2 is 1EF502, hex.

| Bit # | Type | Description |
|---|---|---|
| 0 (MSB) | U | Spare bit. |
| 1–3 | R | Current DL Buffer Size. These bits are equal to 0 (8 frames) after reset. |
| 4–5 | U | Spare bits. |
| 6–15 | R | Current Frame Length in 16-bit words. These bits are equal to 550 after reset. |

Register 3 is the Next Frame Information Register. The address of Register 3 is 1EF503, hex.

| Bit # | Type | Description |
| --- | --- | --- |
| 0 (MSB) | U | Spare bit. |
| 1–3 | W/R | Next DL Buffer Size. These bits will be used when the downlink buffers 402, 404 are swapped. These bits are equal to 0 (8 frames) after reset. |
| 4–5 | U | Spare bits. |
| 6–15 | W/R | Next Frame Length in 16-bit words. These bits will be used when the swap buffer occurs. They are equal to 550 after reset. |

Register 4 is the RS Segment Register. The address of Register 4 is 1EF504, hex. All bits in Register 4 are equal to 0 after

| Bit # | Type | Description |
| --- | --- | --- |
| 0–1 (MSB) | U | Spare bits. |
| 2–7 | R | Current Segment Number. This is the segment of memory used for RS encoding. |
| 8–9 | U | Spare bits. |
| 10–15 | W/R | Next Segment Number. These bits will be used when the downlink buffers 402, 404 are swapped. |

Register 5 is the SCTime Load 1 Register. The address of Register 5 is 1EF505, hex. All bits in Register 5 are reset after PORn, but remain unchanged after software reset. Register 5 is loaded to the SCTR2 (Register 8) at RTI boundaries.

| Bit # | Type | Description |
| --- | --- | --- |
| 0–15 | W/R | SC Time Load 1. Load 16 MSBs of the spacecraft time. |

Register 6 is the SC Time Load 0 Register. The address of Register 6 is 1EF506, hex. All bits in Register 6 are reset after PORn, but remain unchanged after software reset. Register 6 is loaded to the SCTR1 (Register 9) at RTI boundaries.

| Bit # | Type | Description |
| --- | --- | --- |
| 0–15 | W/R | SC Time Load 0. Load 16 middle bits of the spacecraft time. |

Register 7 is the SC Time Read 2 Register. The address of Register 7 is 1EF507, hex. Register 7 can be loaded by software, but not reset by PORn or software reset.

| Bit # | Type | Description |
| --- | --- | --- |
| 0–15 | R | SC Time Read 2. Read 16 MSBs of the spacecraft time. |

Register 8 is the SC Time Read 1 Register. The address of Register 8 is 1EF508, hex. This register can be loaded by software, but not reset by PORn or software reset.

| Bit # | Type | Description |
| --- | --- | --- |
| 0–15 | R | SC Time Read 1. Read 16 middle bits of the spacecraft time. |

Register 9 is the SC Time Read 0 Register. The address of Register 9 is 1EF509, hex. This register can be loaded by software, but not reset by PORn or software reset.

| Bit # | Type | Description |
| --- | --- | --- |
| 0–15 | R | SC Time Read 0. Read 16 LSBs of the spacecraft time. |

Register 10 is the FS Time Read Register. The address of Register 10 is 1EF50A, hex.

| Bit # | Type | Description |
| --- | --- | --- |
| 0–15 | R | FS Time Read. Read 16 LSBs of the spacecraft time at the start of the first frame in the downlink buffer 402, 404. |

Register 11 is the Downlink (DL) Data Rate 1 Register. The address of Register 11 is 1EF50B. All bits in Register 11 are reset after PORn, but remain unchanged after software reset. The downlink data rate in this register will take effect only at RTI boundaries.

| Bit # | Type | Description |
| --- | --- | --- |
| 0–15 | W/R | DL Data Rate Load 1. The two most significant bits of the downlink data rate in 2's complement. |

Register 12 is the DL Data Rate 0 Register. The address of Register 12 is 1EF50C. All bits in this register are reset after PORn, but remain unchanged after software reset.

| Bit # | Type | Description |
| --- | --- | --- |
| 0–15 | W/R | DL Data Rate Load 0. 16 LSBs of the downlink data rate in 2's complement. |

Register 13 is the Zero Register. The address of Register 13 is 1EF50D, hex. This register is used to avoid having the Address Range Error (AREn) signal assert when addressing double words.

| Bit # | Type | Description |
| --- | --- | --- |
| 0–15 | R | All 0s. |

IV. SOFTWARE CONSIDERATION

The flight software has the responsibility to ensure that the time for collecting transfer frames is shorter than the time for sending transfer frames. The RSDL module 102 provides a capability for the flight software to disable the swapping of the downlink buffers 402, 404 before the frame collection is completed. The flight software can enable or disable downlink buffer swapping by setting Bit 1 of Register 0. If this bit is set when a buffer swap occurs, the hardware will swap to the new buffer and this bit is subsequently cleared. Otherwise, the Disabled Buffer Swap Interrupt will be issued. Bit 7 of the Register 1 will be set, and the hardware will swap to the same buffer (swap on itself). The flight software can also mask the Disable Buffer Swap Interrupt by setting Bit 7 of Register 0 to 1. A Begin Buffer Interrupt will always be issued whenever the downlink buffer pointer points to the beginning of the downlink buffer, regardless of whether the swap has actually occurred.

The RSDL Status and Control and RSDL Interrupt Registers (Registers 0 and 1) use a special write scheme that allows access to individual bits. Writing to these registers requires the special bitwrite scheme, as described above.

All internal registers are at the states shown in the following tables after PORn and software reset:

| Register | Value | Description |
| --- | --- | --- |
| | | STATES AFTER PORn |
| 0 | 0x01F0 | Downlink buffer is set to Buffer A 402, all enable bits are reset, all interrupt masks are on, RSDL module 102 is in encoding mode. (Note: For RSDL, mask bits are turned on when they are set to 1.) |
| 1 | 0x0110 | The Disabled Buffer Swap Interrupt (Bit 7) and Begin Buffer Interrupt (Bit 11) are set and all other interrupts are cleared. Note: this value will change to 0x0130 due to the end-of-buffer signal approximately 6 seconds after PORn. |
| 2 | 0x0226 | Number of frames is 8, frame size is 550 words. |
| 3 | 0x0226 | Number of frames is 8, frame size is 550 words. |
| 4 | 0x0000 | Segment 0 is used for RS encoding. |
| 5,6 | 0x0000 | 32 MSBs of the Load spacecraft time are cleared after PORn only. |
| 7,8,9 | Non-Resetable | 48-bit spacecraft time. These registers are loaded by software and will not be reset by the PORn. |
| 10 | Non-Resetable | 16 LSBs of the spacecraft time when the Frame Start occurs. This register is loaded by software and will not be reset by the PORn. |
| 11,12 | 0x0000 | 18-bit downlink data rate is cleared and the DL rate is set to a predefined value 5bit/s after PORn only. |
| | | STATES AFTER RESET |
| 0 | 0x01F0 | Downlink buffer is set to Buffer A 402, all enable bits are reset, all interrupt masks are on, RSDL module 102 is in encoding mode. |
| 1 | 0x0110 | The Disabled Buffer Swap Interrupt (Bit 7) and Begin Buffer Interrupt (Bit 11) are set and all other interrupts are cleared. Note: this value will change to 0x0130 in less than 6 seconds after software reset based on the current downlink rate. |
| 2 | 0x0226 | Number of frames is 8, frame size is 550 words. |
| 3 | 0x0226 | Number of frames is 8, frame size is 550 words. |
| 4 | 0x0000 | Segment 0 is used for RS encoding. |
| 5,6 | unchanged | The contents of these registers are not changed after software reset. |
| 7,8,9 | Non-Resetable | 48-bit spacecraft time. These registers are loaded by software and will not be reset. |
| 10 | Non-Resetable | 16 LSB bits of the spacecraft time when the Frame Start occurs. This register is loaded by software and will not be reset. |
| 11,12 | unchanged | The contents of these registers are not changed after software reset. |

After reset, the flight software must resynchronize transfer frames with the next RTI and mask out unwanted interrupts. The flight software must also redefine (if necessary) the number of frames in the downlink buffer 402, 404, the frame size, the segment number, and the downlink data rate.

The RSDL module 102 generates downlink data rates from 5 bps to 24,8850 bps. The timing unit 210 provides an 18-bit up counter to generate a x12 downlink data rate that is used in the RS encoder 206. (This is described in detail above.) Thus, the following parameters are used to obtain a downlink data rate of 11,060 bps:

| 12 times data rate: | 132,720 |
| --- | --- |
| Divisor: | 11,944,800/132,720 = 90 or 0x5A |
| 18-bit 2's complement: | 0x3FFF − 0x5A = 0x3FFA6 |

Accordingly, the value to be loaded to Register 11 is 3 hex and to Register 12 is 0xFFA6 hex.

V. OPERATION OF THE RSDL MODULE

A. Turning RS Encoding On and Off

The flight software can determine if RS encoding is turned on or off for a current downlink data frame 300 by reading Bit 13 of Register 0, the RSDL Status and Control Register. This bit provides the current RS encoding status and is read-only. A "0" at Bit 13 indicates that RS encoding is turned on, while a "1" indicates that RS encoding is turned off. Both a cold boot and a warm boot clear this bit to 0.

The flight software can turn RS encoding on and off by writing to Bit 15, the RS Encoding Select Bit, of Register 0. Setting the RS Encoding Select Bit to "0" causes RS encoding to be turned on at the next Downlink Frame Resynchronization. (Downlink Frame Resynchronization is discussed in detail below.) Setting the RS Encoding Select Bit to "1" causes RS encoding to be turned off at the next Downlink Frame Resynchronization. Both a cold boot and a warm boot clear this bit to 0.

RS encoding is turned on during normal operation. Thus, both Bits 13 and 15 of Register 0 have the value "0" during normal operation.

B. Selecting a Segment of the RS Memory Buffer

The flight software can select a segment of the RS memory buffer 116. This is done using Bits 2–7 of Register 4, which indicate the memory segment currently being used. These bits are read-only. The RS memory buffer 116 consists of 64 segments, numbered 0–63. Segment 0 corresponds to RS memory buffer 116 addresses 0–127 decimal, Segment 1 corresponds to addresses 128 to 255 decimal, and so on. Both a warm boot and a cold boot clear Bits 2–7 of Register 4 to "0".

The flight software can specify the number of the next RS memory buffer segment by writing to Bits 10–15 of Register 4. The next segment takes effect at the next buffer swap or at the next buffer repeat. Both a cold boot and a warm boot clear these bits to "0."

The flight software will only change the segment number when memory cell failures occur in the RS memory buffer 116. Only the ground station will be able to determine if a memory cell failure has occurred, because the flight software cannot directly access the RS memory buffer 116, and because nothing in the hardware of the RSDL module 102 provides for a check of the RS memory buffer 116. As a result, flight software will only switch to a new RS memory segment in response to a command from the ground station.

Preferably, the RSDL module 102 does not use all the memory location in a segment. The information in the unused locations may be used if memory failures occur during ground testing. For example, the RSDL module 102 can be made to use only 80 of the 128 memory locations in a segment. Thus, only locations 0 to 39 and 64 to 103 could be designated in use for segment 0. Locations 40 to 63 and 104 to 127 would then be unused. The relative locations of the used and unused portions of memory will be the same for the other segments.

C. Initialization of the RS Buffer Memory

The hardware in the RS encoder 206 assumes that the segment of the RS memory buffer 116 to be used contains all 0's at the start of each downlink data frame 300. The RS check bits 306 for that frame 300 will be corrupted if the segment does not contain all 0's. The RS memory buffer 116 contains random data after power-up. Only one method exists by which the bits in a segment all get cleared to "0": the RS encoder 116 automatically sets all of the bits in that one segment of memory to "0" at the end of a downlink data frame 300 when the RS encoder 106 reads the check bits 306 out of the RS memory buffer 116.

This has four implications. First, the check bits 306 for the first downlink data frame 300 will be corrupted when power is first turned on. Check bits for subsequent downlink data frames will be uncorrupted. Second, the new memory segment is not zeroed out and does not contain random data whenever a new segment is selected. Therefore, the first set of check bits accumulated in the new memory segment will be corrupted. The check bits 306 for subsequent downlink data frames will be uncorrupted. Third, a warm boot occurs asynchronous to RSDL operation. This means that the RSDL module 102 will most likely be in the middle of processing a downlink data frame 300 when the warm boot interrupts operation. The check bits 306 for the first downlink data frame 300 will be corrupted after the warm boot. The check bits 306 for subsequent downlink data frames 300 will be uncorrupted. Fourth, flight software ensures that Downlink Frame Resynchronization (see below) coincides with the end of a downlink frame 300 during normal operation. If the flight software forces a Downlink Frame Resynchronization in the middle of a downlink data frame, check bits 306 for the first downlink data frame after the resynchronization will be corrupted. Check bits for subsequent downlink data frames will be uncorrupted.

D. Downlink Data Frame Size and Downlink Buffer Memory Size

Flight software can set the size of the downlink data frame 300. The flight software does this by selecting the number of words in a downlink data frame 300 by writing to Bits 6–15 in the Next Frame Information Register (Register 3). Preferably, however, frame size will always be 550 words (i.e., Bits 6–15 of Register 3=226x). Both a warm boot and a cold boot cause the frame size to be set to 550 words.

The flight software can also select the size of the downlink buffer 402, 404. The flight software in some cases may use a single downlink buffer size the entire time it is operating at a given downlink data rate. Alternatively, the flight software can vary the buffer size. Two criteria exist for choosing the downlink buffer size. First, repeat cycle boundaries (see FIG. 13) should coincide with the start of a downlink buffer. This means that an integer number of buffers should exist in the repeat cycle. Second, the buffer size should be as large as possible and still meet the first criterion.

Figure 13:
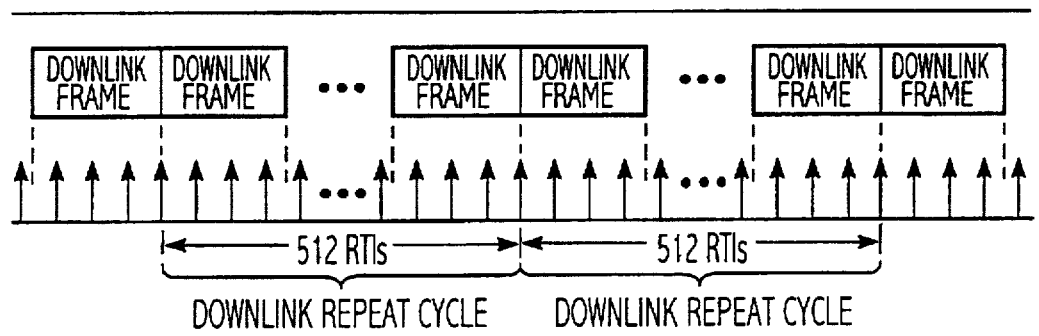
FIG. 13 shows the timing relationship between downlink data frames and real-time interrupts in the RSDL module.

For example, FIG. 13 shows the repeat cycle for a downlink data rate of 248,815 bps. Each transfer frame in this case has 10,112 bits, assuming 550 words per frame, and assuming that RS encoding is turned on. The repeat cycle is 512 RTIs per downlink repeat cycle. In consequence, exactly 225 buffers of data are sent out for every repeat cycle.

The flight software must specify the downlink buffer size in both the RSDL module 102 and the SSRIU 114. Flight software can specify in the RSDL module 102 the number of downlink data frames in a downlink buffer by writing to Bits 1–3 in the Next Frame Information Register (Register 3). Downlink buffer size is then equal to the number of downlink data frames times the downlink data frame size. The new downlink buffer size takes effect at the next buffer swap. The flight software can specify in the SSRIU 114 the total size of the downlink buffer 402, 404 by setting the start and end address of the downlink buffer 402, 404.

The downlink buffer 402, 404 should be specified to be the same size in the RSDL module 102 as in the SSRIU 114.

E. Buffer Swap Versus Buffer Repeat

The flight software can enable or disable downlink buffer swapping via the Buffer Swap Enable Bit (Bit 1) in the RSDL Status and Control Register (Register 0). The new buffer is swapped and the buffer swap enable bit is cleared when the Buffer Swap Enable Bit is set to "1" and when the end of the current buffer is reached. The same buffer is repeated beginning at the buffer start address when the Buffer Swap Enable bit is set to "0" and when the end of the current buffer is reached. In addition, the Disable Buffer Swap Interrupt bit (Bit 7) of the RSDL Interrupt Register (Register 1) will be asserted when the same buffer is repeated.

The Begin Buffer Interrupt bit (Bit 11) in the RSDL Interrupt Register (Register 1) is asserted when either a buffer swap or buffer repeat occurs and when the buffer pointer points to the start of the buffer. Also, the 16 LSBs of the spacecraft time are captured in the Buffer Start Time Read Register (Register 10) when either a buffer swap or buffer repeat occurs and when the buffer pointer points to the start of the buffer.

The hardware of the RSDL module 102 selects as the downlink buffer the buffer specified by the DL Force Buffer ID bit (Bit 14) in Register 0, regardless of the value of the Buffer Swap Enable bit. This selection is made when the Force Buffer bit (Bit 3) in Register 0 is "1" and a Downlink Frame Resynchronization occurs. A Disable Buffer Swap Interrupt signal is issued, however, if the Buffer Swap Enable bit is not set to "1".

F. Downlink Frame Resynchronization

Downlink Frame Resynchronization is used to ensure that the start of a downlink data frame 300 periodically aligns precisely with an RTIn signal. This periodic alignment is used to support time correlation packets, which are described in the following section.

FIG. 13 shows that the periodic alignment of the start of a downlink data frame with an RTIn defines a downlink repeat cycle boundary. The downlink repeat cycle in FIG. 13 has 512 RTIs per cycle. The flight software should perform a Downlink Frame Resynchronization at every downlink repeat cycle boundary, because of clock drift in the RSDL hardware and the possibility of the flight software losing track of its place in a repeat cycle. Thus, it is important to perform Downlink Frame Resynchronization at every repeat cycle boundary, even though the start of a downlink data frame is automatically aligned with an RTI when Downlink Frame Resynchronization has been performed once.

Figure 14:
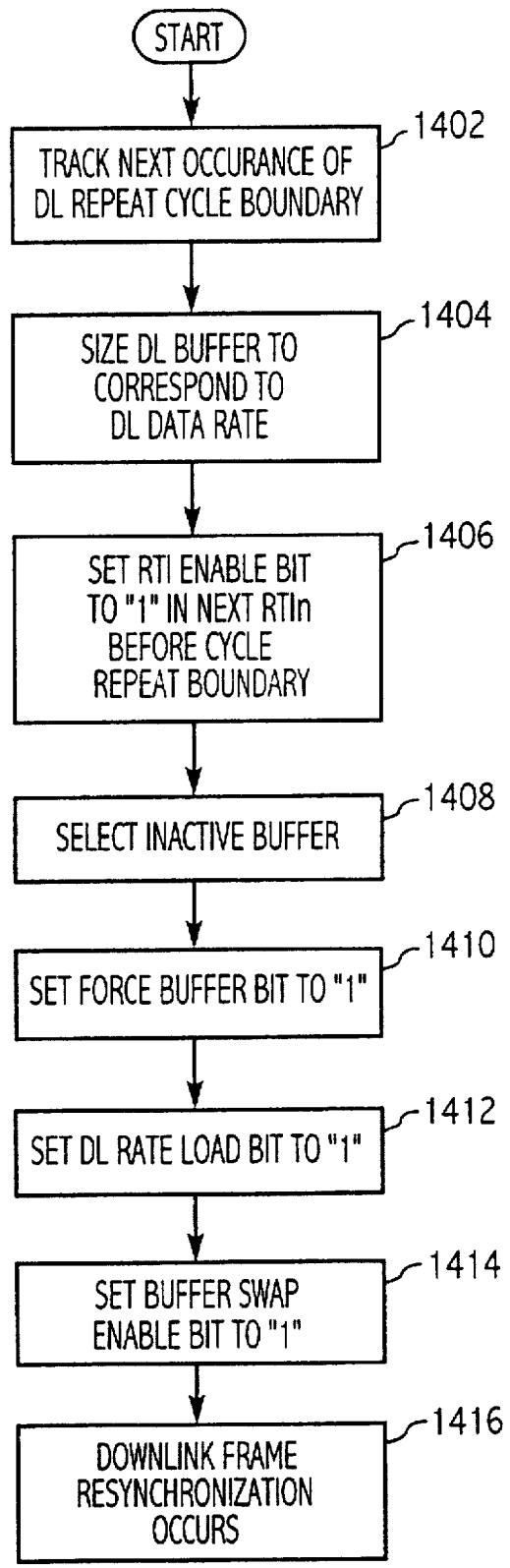
FIG. 14 is a schematic diagram for the circuitry that produces the RSDL interrupt signal.

FIG. 14 is a flow diagram illustrating how the flight software performs a Downlink Frame Resynchronization at every downlink repeat cycle boundary. Flight software first (Step 1402) keeps track of when the next downlink repeat cycle boundary will occur after a Downlink Frame Resynchronization. Preferably, the flight software does this by counting RTIs. It should be recognized, however, that there are other ways for the flight software to determine when the next downlink repeat cycle boundary will occur.

Next (Step 1404), flight software sizes the downlink buffer 402, 404 for a given downlink data rate, such that the start of a buffer coincides with the repeat cycle boundary. The flight software then sets the Sync RTI Enable bit in Register 0 to a "1" (Step 1406) in the next RTI before the upcoming cycle repeat boundary. Step 1406 forces a Downlink Frame Resynchronization to occur at the next RTI.

The flight software then sets to "1" the DL Force Buffer ID bit in Register 0 to select the inactive buffer (Step 1408), which should be full of downlink transfer frames. The Force Buffer bit in Register 0 is also set to a "1" (Step 1410). This is done so that the buffer specified by the DL Force Buffer ID bit will be used at the next RTI. The DL Rate Load bit in Register 0 is then set to "1" during the RTI period (Step 1412). This allows the RSDL hardware to perform the Downlink Frame Resynchronization smoothly.

The flight software then sets the Buffer Swap Enable bit in Register 0 to a "1" (Step 1414). This is done to prevent the Disable Buffer Swap Interrupt bit in Register 1 from being asserted. Finally, the Downlink Frame Resynchronization occurs (Step 1416), and the buffer specified by the DL Force Buffer ID bit is used at the next RTI.

The RSDL hardware performs a Downlink Frame Resynchronization with no loss of data if the resynchronization occurs at a downlink repeat cycle boundary. Two downlink frames will be corrupted, however, if the flight software forces a Downlink Frame Resynchronization in the middle of the repeat cycle. In this case, the downlink data frame 300 prior to the resynchronization is terminated in the middle, and the RS check bits 306 in the downlink data frame 300 are also corrupted following the resynchronization. All subsequent frames, however, will be uncorrupted.

G. Buffer Start Time Correlation

The ground station keeps track of drift in the spacecraft clock by using a Time Correlation Packet. The Time Correlation Packet is sent to the ground station once every downlink repeat cycle. A Time Correlation Packet can appear anywhere in the repeat cycle. The Time Correlation Packet contains the "time" at which the first bit in the first downlink data frame 300 in the downlink repeat cycle is sent from the command data subsystem 100 to the RF transmitter 118. Here, the "time" is the spacecraft time. The flight software obtains this "time" by reading the 16 LSBs of spacecraft time captured in the Buffer Start Time Read Register, by reading the 16 middle bits of spacecraft time from the SC Time Read 1 Register (Register 8), and by reading the 16 MSBs of spacecraft time from the SC Time Read 2 Register (Register 7).

The RSDL module 102 captures the 16 LSBs of the current time in the Buffer Start Time Read Register whenever it is swapped at the start of either downlink buffer 402, 404. That is, the contents of the Buffer Start Time Read Register correspond to the time that the first bit in the synchronization pattern 302 in the first downlink data frame 300 associated with the first transfer frame in the buffer is sent to the RF transmitter 118.

The Buffer Start Time Read Register contains the time that the first bit in the first downlink data frame in the read cycle is sent from the command data subsystem 100 to the RF transmitter 118 after a Downlink Frame Resynchronization. The flight software must read the contents of this register before the next downlink buffer swap or downlink buffer repeat. The RSDL hardware overwrites the contents of this register at the next downlink buffer swap or downlink buffer repeat.

H. RSDL Module Interrupts

The RSDL module 102 can assert an interrupt on the subassembly bus 106. This interrupt generates a level 12 IOIC channel 3 interrupt in the flight computer 104.

Five conditions exist that can result in the interrupt being asserted within the RSDL module 102. The occurrence of any one of these five conditions sets one of Bits 7–11 in the RSDL Interrupt Register (Register 1): Bit 7, Bit 8, Bit 9, Bit 10, or Bit 11. The meaning of each of these bits is described in detail above. A mask bit corresponds to each of these interrupt bits. The mask bits are contained in Bits 7–11 of Register 0. Those bits correspond to Bits 7–11 of Register 1, which holds the interrupt bits. The corresponding interrupt bit is masked when the mask bit is set to "1".

Figure 15:
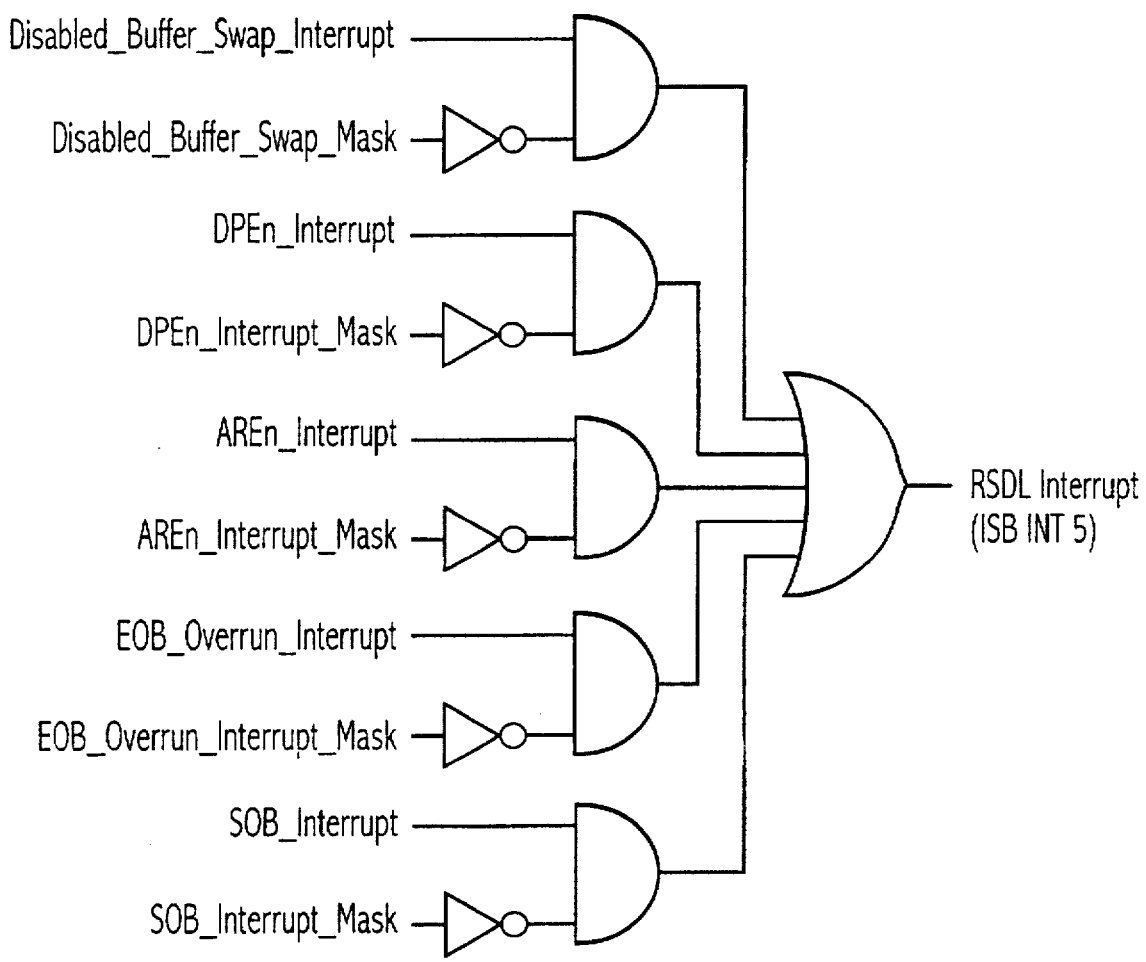
FIG. 15 is a diagram showing the circuit used to generate the RSDL interrupt signal.

FIG. 15 shows that the five interrupt bits are logically ANDed with the corresponding inverted mask bit and then logically ORed together to produce the interrupt. In consequence, an interrupt bit remains set to "1" until the flight software clears it. The RSDL interrupt is asserted where all of the interrupt bits are unmasked and if one or more of the interrupt bits are set to a "1". The flight software must reset all of the interrupt bits to 0 for the RSDL interrupt to clear.

Although only a few embodiments have been described in detail above, those having ordinary skill in the art will readily realize that many modifications are possible without departing from the advantageous teaching therein. For example, a hardware embodiment has been described above for carrying out various functions. Many advantages of the present invention are obtained from the hardware operation. However it should be understood by those having ordinary skill in the art that certain of these advantages and functions can also be carried out in software. For example, a special purpose digital signal processor could be appropriately programmed with firmware to carry out the functions of this assembly. It should be understood that these systems are not limited, therefore, to hardware. Other similar modifications would also be apparent to those having ordinary skill in the art, and are intended to be encompassed within the following claims.

We claim:

1. A monolithic Reed-Solomon downlink (RSDL) encoding chip for processing downlink frames to be transmitted from a spacecraft to a ground station, each downlink frame including a synchronization pattern and a transfer frame, the RSDL encoding chip being couplable to first and second data buffers for storing transfer frames and to a data bus, the RSDL encoding chip comprising:

a. a timing device for maintaining a spacecraft time and for generating an internal signal for controlling timing of the RSDL encoding chip;

b. a bus interface, couplable to the data bus, for interfacing the RSDL encoding chip with a plurality of spacecraft devices external to the RSDL encoding chip;

c. a timing and control unit, coupled to the timing device and to the bus interface, for controlling which of the first and second data buffers can communicate transfer frames to the bus interface;

d. a synchronization pattern unit, coupled to the timing and control unit, for generating the synchronization pattern;

e. a Reed-Solomon encoding unit, coupled to the synchronization pattern unit and to the timing and control unit, for receiving and encoding the transfer frames according to a Reed-Solomon protocol; and f. a bus arbiter, coupled to the bus interface, for arbitrating between the plurality of spacecraft devices and granting access to the data bus to one such device at a time.

2. The RSDL encoding chip of claim 1 wherein the Reed-Solomon encoding unit can be enabled and disabled, such that the transfer frame is not encoded according to the Reed-Solomon protocol when the Reed-Solomon encoding unit is disabled and is encoded according to the Reed-Solomon protocol when the Reed-Solomon encoding unit is enabled; and wherein the Reed-Solomon encoding unit is further for generating at least one check bit when the Reed-Solomon encoding unit is enabled, the check bit providing for error detection and correction on the transfer frame.

3. The RSDL encoding chip of claim 1 wherein the synchronization pattern unit comprises hard-wired circuitry for generating the synchronization pattern.

4. The RSDL encoding chip of claim 1 wherein the Reed-Solomon protocol is a (255, 223) Reed-Solomon code of interleave 5.

5. The RSDL encoding chip of claim 1 wherein the spacecraft time has a resolution of at least about 50 microseconds.

6. The RSDL encoding chip of claim 1 wherein the spacecraft time has a resolution of about 61 microseconds.

7. The RSDL encoding chip of claim 1 wherein the bus arbitrator has two modes of operation, a normal mode and a hog mode; wherein in the normal mode the bus arbitrator grants access to the data bus based on a priority scheme, in which each of the plurality of spacecraft devices has a priority designation; and wherein in the hog mode the bus arbitrator grants access exclusive access to the data bus to a predetermined one of the plurality of spacecraft devices.

8. The RSDL encoding chip of claim 1 wherein each transfer frame has a length; and wherein the length of the transfer frames is programmable.

9. The RSDL encoding chip of claim 1 wherein the number of transfer frames stored in the first and second data buffers is programmable.

10. The RSDL encoding chip of claim 9 wherein the number of transfer frames that can be stored in the first and second data buffers is in a range of 1 to 8.

11. The RSDL encoding chip of claim 1 wherein the timing and control unit is further for generating a downlink data rate.

12. The RSDL encoding chip of claim 11 wherein the downlink data rate is programmable.

13. The RSDL encoding chip of claim 1 wherein a downlink repeat cycle comprises at least one downlink frame; wherein the timing unit is further for generating a plurality of real time interrupt (RTI) signals; and wherein the timing control unit is further for synchronizing the beginning of each downlink repeat cycle with one of the plurality of RTI signals.

14. The RSDL encoding chip of claim 13 wherein 512 RTIs are generated for each downlink repeat cycle.

15. The RSDL encoding chip of claim 13 wherein each downlink frame has a plurality of bits; wherein a time correlation stamp is generated for each downlink repeat cycle, the time correlation stamp corresponding to the time at which the first bit in the first downlink frame of a downlink repeat cycle is transmitted from the spacecraft to the ground station.

16. A method for processing downlink frames to be transmitted from a spacecraft to a ground station, each downlink frame including a synchronization pattern and a transfer frame, the spacecraft including an RSDL encoding chip, first and second data buffers for storing transfer frames, and a plurality of spacecraft devices external to the RSDL encoding chip, the method comprising the steps of:

(a) maintaining spacecraft time in the RSDL encoding chip;

(b) interfacing the RSDL encoding chip via a data bus with the plurality of spacecraft devices;

(c) controlling which of the first and second data buffers can communicate transfer frames to the RSDL encoding chip;

(d) selectively encoding the transfer frames in the RSDL module according to a Reed-Solomon protocol;

(e) generating a plurality of check bits in the RSDL module if the transfer frames are encoded, the check bits providing for error detection and correction on the transfer frame; and (f) arbitrating between the plurality of spacecraft devices and granting access to the data bus to one such device at a time.

17. A Reed-Solomon downlink (RSDL) encoding device for processing downlink frames to be transmitted from a spacecraft to a ground station, comprising:

(a) a device for generating a low resolution spacecraft time;

(b) an oscillator for generating a timing signal; and (b) a clock divider for generating a high resolution timing signal having a higher resolution than the low resolution spacecraft time, including:

(1) a first counter for generating a pseudo signal that has a predetermined number of pulses in a predetermined time interval, wherein at least one of the pulses has a different period than the remainder of the pulses;

(2) a second counter for receiving and processing the pseudo signal to obtain the high resolution timing signal.

18. The RSDL encoding device of claim 17 wherein the timing signal has a frequency of 11,944.800 Hz and the pseudo signal has a frequency of 16,384 Hz.

19. The RSDL encoding device of claim 17 wherein one of the pulses is longer than the remainder of the pulses by a factor of 28/27.

20. A monolithic Reed-Solomon downlink (RSDL) encoding chip for processing downlink frames to be transmitted from a spacecraft to the ground, each downlink frame including a synchronization pattern and a transfer frame, the RSDL encoding chip being couplable to first and second data buffers for storing transfer frames and to a data bus, the RSDL encoding chip comprising:

a. a timing unit for maintaining spacecraft time, for generating an internal signal for controlling timing of the RSDL encoding chip, and for generating a real time interrupt signal (RTI);

b. a bus interface, couplable to the data bus, for interfacing the RSDL encoding chip with a plurality of spacecraft devices external to the RSDL encoding chip;

c. a timing control unit, coupled to the timing unit and to the bus interface, for controlling which of the first and second data buffers can communicate transfer frames to the bus interface and for synchronizing the RTI with the beginning of a downlink frame;

d. a synchronization pattern unit, coupled to the timing control unit, for generating the synchronization pattern;

e. a Reed-Solomon encoding unit, coupled to the synchronization pattern unit and to the timing control unit, for receiving and encoding the transfer frames according to a Reed-Solomon protocol and for selectively generating a plurality of check bits, the check bits providing for error detection and correction on the transfer frame; and f. a bus arbiter, coupled to the bus interface, for determining which of the plurality of spacecraft devices has access to the data bus.

\* \* \* \* \*